United States Patent
Wengreen et al.

(10) Patent No.: US 10,575,427 B2
(45) Date of Patent: Feb. 25, 2020

(54) MOUNTING SYSTEMS FOR DIGITAL MEDIA PLAYERS

(71) Applicant: Innovelis, Inc., Sammamish, WA (US)

(72) Inventors: Eric John Wengreen, Sammamish, WA (US); Brian Jeffrey Wengreen, Ravensdale, WA (US)

(73) Assignee: Innovelis, Inc., Sammamish, WA (US)

( * ) Notice: Subject to any disclaimer, the term of this patent is extended or adjusted under 35 U.S.C. 154(b) by 0 days.

(21) Appl. No.: 16/375,730

(22) Filed: Apr. 4, 2019

(65) Prior Publication Data

US 2019/0239377 A1   Aug. 1, 2019

Related U.S. Application Data

(63) Continuation of application No. 16/015,122, filed on Jun. 21, 2018, now Pat. No. 10,299,400, which is a continuation of application No. 15/131,337, filed on Apr. 18, 2016, now Pat. No. 10,039,201.

(51) Int. Cl.
| | |
|---|---|
| *H05K 7/14* | (2006.01) |
| *H05K 5/02* | (2006.01) |
| *H04N 5/64* | (2006.01) |
| *F16M 13/02* | (2006.01) |
| *F16M 11/04* | (2006.01) |
| *G06F 1/16* | (2006.01) |
| *G06F 1/20* | (2006.01) |
| *G06F 1/18* | (2006.01) |

(52) U.S. Cl.
CPC .............. *H05K 7/14* (2013.01); *F16M 11/041* (2013.01); *F16M 13/02* (2013.01); *G06F 1/1607* (2013.01); *G06F 1/181* (2013.01); *G06F 1/20* (2013.01); *H04N 5/64* (2013.01); *H05K 5/0204* (2013.01)

(58) Field of Classification Search
CPC .............................. H05K 7/14; H05K 5/0204
USPC ......................................................... 348/836
See application file for complete search history.

(56) References Cited

U.S. PATENT DOCUMENTS

| | | |
|---|---|---|
| 1,618,573 A | 2/1927 | Cole |
| 2,584,646 A | 2/1952 | Wagstaff |
| 3,091,378 A | 5/1963 | O'Dwyer |
| D196,542 S | 10/1963 | Zelnick |
| 3,176,950 A | 4/1965 | Hittesdorf |
| 3,279,009 A | 10/1966 | Teasdale |
| 3,294,298 A | 12/1966 | Danielson |
| 3,311,435 A | 3/1967 | Heritage |
| 3,477,679 A | 11/1969 | Lovitz |
| 3,689,868 A | 9/1972 | Snyder |
| 3,990,617 A | 11/1976 | Carter |
| D242,766 S | 12/1976 | Neece |
| 4,067,532 A | 1/1978 | Viteretto |
| 4,158,450 A | 6/1979 | Suzuki |
| 4,467,244 A | 8/1984 | Dickie |
| 4,519,656 A | 5/1985 | Raz |
| D280,466 S | 9/1985 | Seltzer |
| D282,034 S | 1/1986 | Janke |
| 4,602,761 A | 7/1986 | Carter |

(Continued)

*Primary Examiner* — Jeffery A Williams

(57) ABSTRACT

Mounting systems can attach electronic devices to a wall such as a wall of a television or a wall of a building. Electronic devices can generate a substantial amount of heat that can be trapped by mounting systems. The mount ventilation systems described herein can allow cool air to flow around electronic devices.

20 Claims, 27 Drawing Sheets

(56) References Cited

U.S. PATENT DOCUMENTS

| | | |
|---|---|---|
| 4,697,780 A | 10/1987 | Wenkman |
| 4,746,042 A | 5/1988 | King |
| 4,771,927 A | 9/1988 | Ventura |
| 4,815,683 A | 3/1989 | Ferrante |
| 4,825,590 A | 5/1989 | Cullinane |
| 4,826,115 A | 5/1989 | Novitski |
| 4,840,773 A | 6/1989 | Wade |
| 4,852,843 A | 8/1989 | Chandler |
| 4,949,386 A | 8/1990 | Hill |
| 4,974,764 A | 12/1990 | Cantwell |
| D317,157 S | 5/1991 | Jondelius |
| 5,038,985 A | 8/1991 | Chapin |
| 5,092,395 A | 3/1992 | Amidzich |
| D329,192 S | 9/1992 | Susac |
| 5,160,126 A | 11/1992 | Atkinson |
| 5,227,582 A | 7/1993 | Velasco |
| 5,273,690 A | 12/1993 | McDowell |
| 5,297,318 A | 3/1994 | Adolphson |
| D351,341 S | 10/1994 | Hung |
| 5,375,749 A | 12/1994 | Oliva |
| 5,385,282 A | 1/1995 | Chen |
| 5,400,990 A | 3/1995 | Frankel |
| D359,616 S | 6/1995 | Ishibashi |
| D361,335 S | 8/1995 | Rudkiewicz |
| D361,462 S | 8/1995 | Newham |
| D369,465 S | 5/1996 | Scheid |
| 5,535,093 A | 7/1996 | Noguchi |
| D376,787 S | 12/1996 | Calfee |
| 5,593,124 A | 1/1997 | Wang |
| 5,619,395 A | 4/1997 | McBride |
| 5,619,774 A | 4/1997 | Perry |
| D388,107 S | 12/1997 | Huckins |
| D390,849 S | 2/1998 | Richter |
| 5,850,996 A | 12/1998 | Liang |
| 5,850,998 A | 12/1998 | Parsey |
| D407,408 S | 3/1999 | Hoff |
| D409,079 S | 5/1999 | Sobczynski |
| 5,899,371 A | 5/1999 | Weliver |
| D411,542 S | 6/1999 | Richter |
| 5,914,707 A | 6/1999 | Kono |
| 5,961,083 A | 10/1999 | Hartmann |
| 5,979,724 A | 11/1999 | Loewenthal |
| D420,149 S | 2/2000 | Hersh |
| 6,039,173 A | 3/2000 | Crow |
| D425,353 S | 5/2000 | Foy |
| 6,073,901 A | 6/2000 | Richter |
| 6,102,660 A | 8/2000 | Lee |
| 6,105,923 A | 8/2000 | Robertson |
| D431,250 S | 9/2000 | Richter |
| 6,163,997 A | 12/2000 | Deralas |
| 6,193,546 B1 | 2/2001 | Sadler |
| D443,493 S | 6/2001 | Skeem |
| 6,275,885 B1 | 8/2001 | Chin |
| D451,915 S | 12/2001 | Dalmau |
| 6,336,615 B1 | 1/2002 | Jeon |
| D456,024 S | 4/2002 | Richter |
| D456,413 S | 4/2002 | Malson |
| 6,445,290 B1 | 9/2002 | Fingal |
| 6,485,144 B1 | 11/2002 | Liao |
| 6,503,097 B2 | 1/2003 | Archambault |
| D471,547 S | 3/2003 | Ruohonen |
| 6,554,527 B1 | 4/2003 | O'Donnell |
| 6,560,983 B1 | 5/2003 | Schimmeyer |
| 6,691,374 B2 | 2/2004 | Coyne |
| 6,877,641 B2 | 4/2005 | Howland |
| 6,888,940 B1 | 5/2005 | Deppen |
| D508,605 S | 8/2005 | Hwang |
| 6,939,641 B2 | 9/2005 | Kincaid |
| 6,983,126 B1 | 1/2006 | Saalman |
| D518,704 S | 4/2006 | Miao |
| 7,047,601 B1 | 5/2006 | Vernon-Woods |
| 7,067,737 B2 | 6/2006 | Mallen |
| 7,079,384 B2 | 7/2006 | Wang |
| 7,080,764 B2 | 7/2006 | McNicholas |
| 7,113,218 B2 | 9/2006 | Battles |
| D529,713 S | 10/2006 | Guyot |
| D529,905 S | 10/2006 | Richter |
| D530,713 S | 10/2006 | Richter |
| D533,175 S | 12/2006 | Richter |
| 7,145,603 B2 | 12/2006 | Whitby |
| D535,826 S | 1/2007 | Toghanian |
| D536,239 S | 2/2007 | Tallman |
| 7,222,762 B2 | 5/2007 | Rees |
| D545,343 S | 6/2007 | Braun |
| 7,230,181 B2 | 6/2007 | Simmons |
| D547,863 S | 7/2007 | Heinsch |
| 7,261,264 B2 | 8/2007 | Moran |
| D551,008 S | 9/2007 | Hidalgo |
| D553,352 S | 10/2007 | Allen |
| D557,266 S | 12/2007 | Hughes |
| D560,411 S | 1/2008 | Chung |
| D564,529 S | 3/2008 | Hughes |
| D565,399 S | 4/2008 | Grey |
| D568,889 S | 5/2008 | Hughes |
| 7,367,089 B2 | 5/2008 | Cooke |
| D570,801 S | 6/2008 | Allen |
| D586,795 S | 2/2009 | Richter |
| 7,528,323 B2 | 5/2009 | Wu |
| D596,172 S | 7/2009 | Ahlqvist |
| D597,069 S | 7/2009 | Wengreen |
| D598,945 S | 8/2009 | Gillespie |
| 7,580,255 B2 | 8/2009 | Crooijmans |
| D601,000 S | 9/2009 | Cole |
| D609,030 S | 2/2010 | Barabas |
| D610,579 S | 2/2010 | Behar |
| 7,802,769 B1 | 9/2010 | Lindsey |
| D624,949 S | 10/2010 | Nakayama |
| D625,729 S | 10/2010 | McNames |
| D628,611 S | 12/2010 | Lewis |
| 7,854,420 B2 | 12/2010 | Depay |
| D633,503 S | 3/2011 | Bo |
| 7,959,121 B1 | 6/2011 | Barnes |
| 7,980,435 B2 | 7/2011 | Tages |
| 8,016,107 B2 | 9/2011 | Emsky |
| 8,020,821 B2 | 9/2011 | Chen |
| D648,727 S | 11/2011 | Van Den Nieuwenhuizen |
| 8,074,951 B2 | 12/2011 | Carnevali |
| 8,088,999 B1 | 1/2012 | Payou |
| D657,362 S | 4/2012 | Lister |
| D662,491 S | 6/2012 | Andre |
| 8,203,077 B2 | 6/2012 | Honeycutt |
| D667,411 S | 9/2012 | Kim |
| D669,890 S | 10/2012 | Hopkins |
| 8,282,058 B2 | 10/2012 | Lundrigan |
| 8,297,440 B2 | 10/2012 | Schmidt |
| D672,308 S | 12/2012 | Cobbett |
| 8,322,584 B2 | 12/2012 | Dethmers |
| 8,428,289 B2 | 4/2013 | Wengreen |
| 8,472,660 B2 | 6/2013 | Wengreen |
| D686,629 S | 7/2013 | Trinh |
| D690,707 S | 10/2013 | Minn |
| 8,544,805 B2 | 10/2013 | Virgin |
| D695,748 S | 12/2013 | Morris |
| D700,832 S | 3/2014 | Ng |
| D705,229 S | 5/2014 | Wengreen |
| D710,340 S | 8/2014 | Wengreen |
| D710,363 S | 8/2014 | Wengreen |
| D710,836 S | 8/2014 | Wengreen |
| D712,394 S | 9/2014 | Booth |
| D712,906 S | 9/2014 | Wengreen |
| D713,395 S | 9/2014 | Godycki |
| D713,399 S | 9/2014 | Green |
| D713,835 S | 9/2014 | Sirichai |
| 8,847,549 B2 | 9/2014 | Graham |
| 8,848,113 B2 | 9/2014 | Wengreen |
| D714,793 S | 10/2014 | Kim |
| 8,864,517 B2 | 10/2014 | Cohen |
| D716,580 S | 11/2014 | Wengreen |
| D717,307 S | 11/2014 | Chun |
| D717,804 S | 11/2014 | Budge |
| 8,896,768 B1 | 11/2014 | Wengreen |
| 8,934,060 B1 | 1/2015 | Wengreen |
| 8,934,061 B1 | 1/2015 | Wengreen |
| 8,939,417 B1 | 1/2015 | Wengreen |

(56) References Cited

U.S. PATENT DOCUMENTS

| | | |
|---|---|---|
| D723,042 S | 2/2015 | Lee |
| 8,988,616 B2 | 3/2015 | Wengreen |
| D729,544 S | 5/2015 | Wengreen |
| D732,939 S | 6/2015 | Cannaverde |
| D733,105 S | 6/2015 | Wengreen |
| 9,065,263 B2 | 6/2015 | Porcano |
| D733,542 S | 7/2015 | Cannaverde |
| D733,691 S | 7/2015 | Wengreen |
| D734,305 S | 7/2015 | Wengreen |
| D735,174 S | 7/2015 | Wengreen |
| D739,410 S | 9/2015 | Chun |
| 9,131,195 B2 | 9/2015 | Wengreen |
| 9,163,779 B2 | 10/2015 | Funk |
| D742,387 S | 11/2015 | Xiang |
| 9,185,953 B2 | 11/2015 | Whitten |
| D746,599 S | 1/2016 | Olson |
| D749,549 S | 2/2016 | Wengreen |
| D749,597 S | 2/2016 | Wengreen |
| D750,633 S | 3/2016 | Minn |
| D751,563 S | 3/2016 | Wengreen |
| D752,415 S | 3/2016 | Lu |
| 9,339,112 B2 | 5/2016 | Wengreen |
| D759,005 S | 6/2016 | Murakami |
| D761,236 S | 7/2016 | Wengreen |
| D763,666 S | 8/2016 | Wengreen |
| D763,835 S | 8/2016 | Wengreen |
| D765,063 S | 8/2016 | Wengreen |
| D765,064 S | 8/2016 | Wengreen |
| 9,404,615 B1 | 8/2016 | Gonzalez |
| D765,646 S | 9/2016 | Deng |
| D765,651 S | 9/2016 | Liu |
| D767,377 S | 9/2016 | Sekula |
| D770,171 S | 11/2016 | Lai |
| D772,217 S | 11/2016 | Alesi |
| D772,859 S | 11/2016 | Alesi |
| D777,167 S | 1/2017 | Wengreen |
| 9,543,082 B1 | 1/2017 | Wengreen |
| 9,551,454 B2 | 1/2017 | Lipke |
| D779,466 S | 2/2017 | Wengreen |
| 9,578,960 B1 | 2/2017 | Wu |
| D795,820 S | 8/2017 | Wengreen |
| D797,750 S | 9/2017 | Wengreen |
| D798,305 S | 9/2017 | Wengreen |
| D798,306 S | 9/2017 | Wengreen |
| D803,030 S | 11/2017 | Wengreen |
| D804,289 S | 12/2017 | Wengreen |
| D806,521 S | 1/2018 | Wengreen |
| D808,367 S | 1/2018 | Wengreen |
| D812,064 S | 3/2018 | Wengreen |
| D813,241 S | 3/2018 | Wengreen |
| D824,399 S | 7/2018 | Wengreen |
| 10,021,468 B2 | 7/2018 | Wengreen |
| 10,036,937 B1 | 7/2018 | Wengreen |
| 10,039,201 B2 | 7/2018 | Wengreen |
| D825,643 S | 8/2018 | Wengreen |
| 10,084,300 B1 | 9/2018 | Glahe |
| D832,274 S | 10/2018 | Wengreen |
| 10,117,344 B2 | 10/2018 | Wengreen |
| D832,858 S | 11/2018 | Wengreen |
| D834,029 S | 11/2018 | Wengreen |
| 10,194,544 B2 | 1/2019 | Wengreen |
| D841,076 S | 2/2019 | Wengreen |
| 10,199,782 B1 | 2/2019 | Wengreen |
| 2002/0079864 A1 | 6/2002 | Soumi |
| 2004/0159490 A1 | 8/2004 | Marlin |
| 2005/0023419 A1 | 2/2005 | Frankel |
| 2005/0211861 A1* | 9/2005 | Lee ............... G06F 1/1607 248/309.1 |
| 2005/0236541 A1 | 10/2005 | Chang |
| 2006/0186290 A1 | 8/2006 | Carnevali |
| 2006/0224575 A1 | 10/2006 | Ostojic |
| 2006/0274495 A1 | 12/2006 | Nakamura |
| 2007/0097617 A1 | 5/2007 | Searby |
| 2007/0235609 A1 | 10/2007 | Chun |
| 2007/0264169 A1 | 11/2007 | Chen |
| 2008/0067298 A1 | 3/2008 | Mossman |
| 2008/0078793 A1 | 4/2008 | Brown |
| 2008/0149796 A1 | 6/2008 | Moscovitch |
| 2009/0218454 A1 | 9/2009 | Stanley |
| 2009/0230161 A1 | 9/2009 | Emsky |
| 2009/0270727 A1 | 10/2009 | Zhao |
| 2009/0296997 A1 | 12/2009 | Rocheford |
| 2010/0193658 A1 | 8/2010 | Beger |
| 2010/0270190 A1 | 10/2010 | Howard |
| 2010/0281671 A1 | 11/2010 | De Vaan |
| 2010/0288895 A1 | 11/2010 | Shamie |
| 2010/0314277 A1 | 12/2010 | Murray |
| 2011/0000945 A1 | 1/2011 | Mongan |
| 2011/0242439 A1 | 10/2011 | Calderon |
| 2012/0025035 A1 | 2/2012 | Huang |
| 2012/0126081 A1 | 5/2012 | Wengreen |
| 2012/0127379 A1 | 5/2012 | Wengreen |
| 2012/0168516 A1 | 7/2012 | Bolger |
| 2012/0280014 A1 | 11/2012 | Lopez-Apodaca |
| 2012/0312950 A1 | 12/2012 | Sears |
| 2012/0320506 A1 | 12/2012 | Bentz |
| 2013/0032617 A1 | 2/2013 | Adelman |
| 2013/0050932 A1 | 2/2013 | Williams |
| 2013/0069507 A1* | 3/2013 | Dowling ............. F16M 11/10 312/236 |
| 2013/0092811 A1 | 4/2013 | Funk |
| 2014/0061406 A1 | 3/2014 | Chevalier |
| 2014/0103179 A1 | 4/2014 | Lipke |
| 2014/0147093 A1 | 5/2014 | Wengreen |
| 2014/0241705 A1 | 8/2014 | Wengreen |
| 2015/0036863 A1 | 2/2015 | Wen |
| 2015/0070835 A1 | 3/2015 | McLean |
| 2015/0125002 A1 | 5/2015 | Van Den Nieuwenhuizen |
| 2015/0184796 A1 | 7/2015 | Wengreen |
| 2015/0212544 A1 | 7/2015 | Chen |
| 2015/0305502 A1 | 10/2015 | Wengreen |
| 2016/0007735 A1 | 1/2016 | Gallup |
| 2016/0119458 A1 | 4/2016 | Gunther |
| 2016/0120295 A1 | 5/2016 | Rowley |
| 2016/0218535 A1 | 7/2016 | Prete |
| 2016/0234955 A1 | 8/2016 | Wengreen |
| 2016/0241289 A1 | 8/2016 | Wieth |
| 2017/0150620 A1 | 5/2017 | Wengreen |
| 2017/0208945 A1 | 7/2017 | Wengreen |
| 2018/0216779 A1 | 8/2018 | Damiano |
| 2019/0004402 A1 | 1/2019 | Wengreen |

* cited by examiner

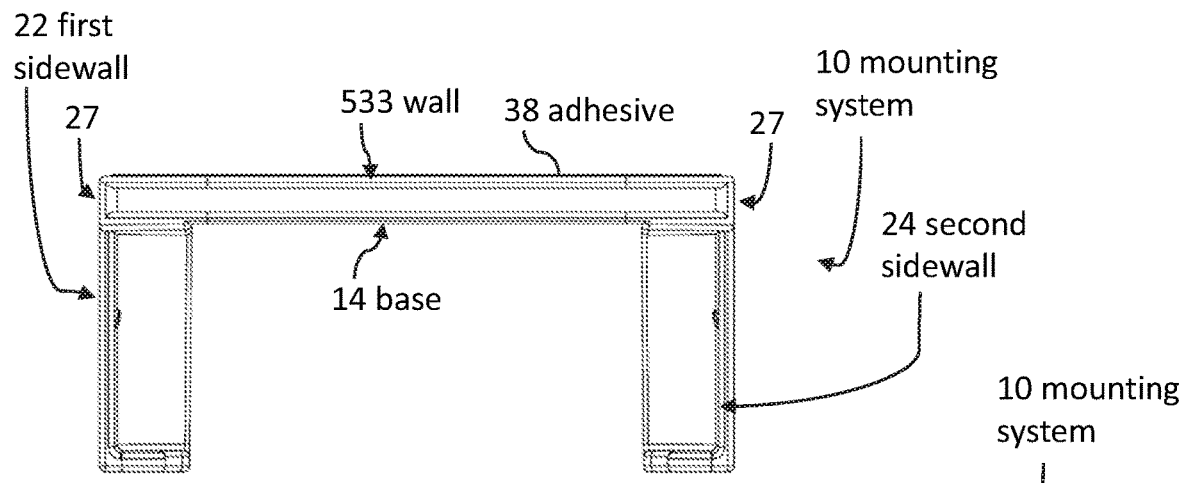
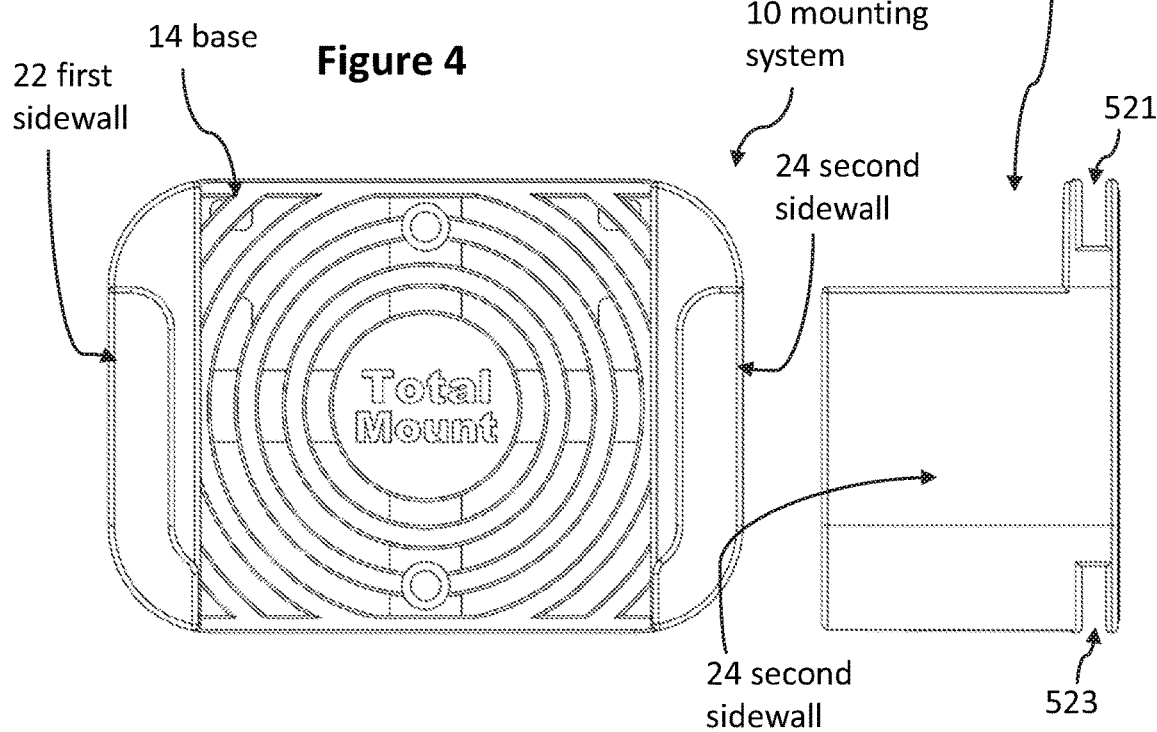
Figure 4
Figure 5
Figure 6

MOUNTING SYSTEMS FOR DIGITAL MEDIA PLAYERS

CROSS-REFERENCE TO RELATED APPLICATIONS

The entire contents of the following application are incorporated by reference herein: U.S. patent application Ser. No. 13/278,759; filed Oct. 21, 2011; and entitled MOUNTING SYSTEM FOR DIGITAL MEDIA PLAYERS.

The entire contents of the following application are incorporated by reference herein: U.S. patent application Ser. No. 13/332,373; filed Dec. 21, 2011; and entitled MOUNTING SYSTEM FOR DIGITAL MEDIA PLAYERS.

The entire contents of the following application are incorporated by reference herein: U.S. patent application Ser. No. 14/169,148; filed Jan. 30, 2014; and entitled MOUNTING METHODS FOR DIGITAL MEDIA PLAYERS.

The entire contents of the following application are incorporated by reference herein: U.S. patent application Ser. No. 14/209,452; filed Mar. 13, 2014; and entitled MOUNTING METHODS FOR DIGITAL MEDIA PLAYERS.

The entire contents of the following application are incorporated by reference herein: U.S. patent application Ser. No. 14/478,665; filed Sep. 5, 2014; and entitled MOUNTING SYSTEMS FOR DIGITAL MEDIA PLAYERS.

The entire contents of the following application are incorporated by reference herein: U.S. patent application Ser. No. 14/527,687; filed Oct. 29, 2014; and entitled MOUNTING SYSTEMS FOR DIGITAL MEDIA PLAYERS.

The entire contents of the following application are incorporated by reference herein: U.S. patent application Ser. No. 14/260,577; filed Apr. 24, 2014; and entitled MOUNTING SYSTEMS FOR ELECTRONIC DEVICES.

The entire contents of the following application are incorporated by reference herein: U.S. patent application Ser. No. 14/572,293; filed Dec. 16, 2014; and entitled MOUNTING SYSTEMS FOR ELECTRONIC DEVICES.

The entire contents of the following application are incorporated by reference herein: U.S. patent application Ser. No. 29/532,043; filed Jul. 1, 2015; and entitled MOUNT FOR ELECTRONIC DEVICES.

The entire contents of the following application are incorporated by reference herein: U.S. patent application Ser. No. 13/779,733; filed Feb. 27, 2013; and entitled LINE OF SIGHT MOUNTING SYSTEM FOR DIGITAL MEDIA PLAYERS.

The entire contents of the following application are incorporated by reference herein: U.S. patent application Ser. No. 13/781,717; filed Feb. 28, 2013; and entitled LINE OF SIGHT MOUNTING SYSTEM FOR DIGITAL MEDIA PLAYERS.

The entire contents of the following application are incorporated by reference herein: U.S. patent application Ser. No. 14/480,830; filed Sep. 9, 2014; and entitled MOUNTING SYSTEMS FOR DIGITAL MEDIA PLAYERS.

The entire contents of the following application are incorporated by reference herein: U.S. patent application Ser. No. 14/482,070; filed Sep. 10, 2014; and entitled MOUNTING SYSTEMS FOR DIGITAL MEDIA PLAYERS.

The entire contents of the following application are incorporated by reference herein: U.S. Patent Application No. 62/243,722; filed Oct. 20, 2015; and entitled MOUNTING SYSTEMS FOR DIGITAL MEDIA PLAYERS.

The entire contents of the following application are incorporated by reference herein: U.S. patent application Ser. No. 29/542,647; filed Oct. 15, 2015; and entitled MOUNT FOR ELECTRONIC DEVICES.

The entire contents of the following application are incorporated by reference herein: U.S. Patent Application No. 62/252,652; filed Nov. 9, 2015; and entitled MOUNTING SYSTEMS AND KITS FOR DIGITAL MEDIA PLAYERS.

The entire contents of the following application are incorporated by reference herein: U.S. Patent Application No. 62/245,723; filed Oct. 23, 2015; and entitled MOUNTING SYSTEMS FOR ELECTRICAL CABLES.

The entire contents of the following application are incorporated by reference herein: U.S. Patent Application No. 62/242,988; filed Oct. 16, 2015; and entitled MOUNTING SYSTEMS FOR REMOTE CONTROLS.

The entire contents of the following application are incorporated by reference herein: U.S. Patent Application No. 62/242,968; filed Oct. 16, 2015; and entitled MOUNTING SYSTEMS FOR DIGITAL MEDIA PLAYERS.

The entire contents of the following application are incorporated by reference herein: U.S. Patent Application No. 62/241,948; filed Oct. 15, 2015; and entitled MOUNTING SYSTEMS FOR DIGITAL MEDIA PLAYERS.

The entire contents of the following application are incorporated by reference herein: U.S. Patent Application No. 62/239,125; filed Oct. 8, 2015; and entitled MOUNTING SYSTEMS FOR DIGITAL MEDIA PLAYERS.

The entire contents of the following application are incorporated by reference herein: U.S. Patent Application No. 62/234,610; filed Sep. 29, 2015; and entitled MOUNTING SYSTEMS FOR DIGITAL MEDIA PLAYERS.

The entire contents of the following application are incorporated by reference herein: U.S. patent application Ser. No. 29/542,610; filed Oct. 15, 2015; and entitled MOUNT FOR ELECTRONIC DEVICES.

The entire contents of the following application are incorporated by reference herein: U.S. patent application Ser. No. 29/541,839; filed Oct. 8, 2015; and entitled CABLE HOLDER.

The entire contents of the following application are incorporated by reference herein: U.S. patent application Ser. No. 14/169,148; filed Jan. 30, 2014; and entitled MOUNTING METHODS FOR DIGITAL MEDIA PLAYERS.

The entire contents of the following application are incorporated by reference herein: U.S. patent application Ser. No. 29/514,250; filed Jan. 9, 2015; and entitled MOUNT FOR ELECTRONIC DEVICES.

The entire contents of the following application are incorporated by reference herein: U.S. patent application Ser. No. 29/522,576; filed Mar. 31, 2015; and entitled MOUNT FOR ELECTRONIC DEVICES.

The entire contents of the following application are incorporated by reference herein: U.S. patent application Ser. No. 15/089,181; filed Apr. 1, 2016; and entitled MOUNTING SYSTEMS FOR REMOTE CONTROLS.

The entire contents of the following patent are incorporated by reference herein: U.S. Pat. No. D716,580; issued Nov. 4, 2014; and entitled REMOTE CONTROL HOLDER.

BACKGROUND

Field

Various embodiments disclosed herein relate to mounting systems and mounting methods. Certain embodiments relate to mounting systems for electronic devices such as digital media players.

Description of Related Art

Electronic devices can be electronically and even physically coupled to other electronic devices. For example, a digital media player can be coupled to a television by a High-Definition Multimedia Interface (HDMI) cable to enable the television to display media, such as movies, from the digital media player. The digital media player can receive media from the Internet through many different content providers such as Netflix Inc.

Mounting systems can be used to couple electronic devices to a wall. Mounting systems can hold electronic devices while the electronic devices provide media from the Internet to televisions. There is a need for systems and methods to reliably mount electronic devices to diverse types of walls and surfaces.

SUMMARY

Mounting systems can be used to couple electronic devices to a wall, such as a wall of a building or a wall of a television. In some embodiments, the mounting system can couple electronic devices to a backside of a television such that a portion of the mounting system is located between the backside of the television and an electronic device such as a digital media player.

In some embodiments, a mounting system is configurable to couple an electronic device to a television. Mounting systems can comprise a base; a first sidewall that protrudes outward from the base; and/or a second sidewall that protrudes outward from the base such that the mounting system is configured to hold a least a portion of the electronic device between the first and second sidewalls.

In several embodiments, mounting systems comprise an anchor wall oriented within plus or minus 30 degrees of parallel to the base and coupled to the base by at least one connecting protrusion that protrudes inward from the base to the anchor wall; an adhesive coupled to the anchor wall and configured to couple the mounting system to the television; a first ventilation channel located between the base and the anchor wall; and/or a second ventilation channel in fluid communication with the first ventilation channel. The second ventilation channel can be oriented outward from the first ventilation channel such that the second ventilation channel is in fluid communication with an area between the first and second sidewalls, wherein the area is configured to hold the portion of the electronic device.

Mounting systems can include a base configured to hold the electronic device such that a portion of the base is located between the television and the electronic device. The base can comprise a bottom portion and a top portion. Mounting systems can also include a first ventilation channel located between a first wall and a second wall of the base. The first ventilation channel can continue from the bottom portion to the top portion of the base. As well, mounting systems can include a second ventilation channel in fluid communication with the first ventilation channel. The second ventilation channel can extend outward from the first ventilation channel such that the second ventilation channel fluidly couples the first ventilation channel with a portion of the mounting system configured to hold the electronic device.

In some embodiments, the first channel continues from a bottom portion of the base to a top portion of the base. In some embodiments, the bottom portion contains a first open end configured to provide access to electrical ports of the electronic device, and the top portion contains a second open end.

As well, in some embodiments, the mounting system further comprises a third channel in fluid communication with the first channel. The third channel can extend outward from the first channel such that the third channel fluidly couples the first channel with the portion of the mounting system configured to hold the electronic device. The mounting system can further comprise an adhesive configured to couple the base to the television. In some embodiments, a first central axis of the first channel is within plus or minus twenty degrees of a plane of the adhesive.

The second channel and the third channel can be within plus or minus forty degrees of being perpendicular to the first central axis of the first channel. As well, a second central axis of the second channel can be within plus or minus thirty degrees of a third central axis of the third channel. In some embodiments, a third central axis of the third channel can be substantially parallel to a second central axis of the second channel.

In some embodiments, the mounting system includes a fourth channel in fluid communication with the first channel. The fourth channel can extend outward from the first channel such that the fourth channel fluidly couples the first channel with the portion of the mounting system configured to hold the electronic device. The mounting system can even include a fifth channel in fluid communication with the first channel. The fifth channel can extend outward from the first channel such that the fifth channel fluidly couples the first channel with the portion of the mounting system configured to hold the electronic device.

The mounting system can further include a sixth channel in fluid communication with the first channel. The sixth channel can extend outward from the first channel such that the sixth channel fluidly couples the first channel with the portion of the mounting system configured to hold the electronic device. The mounting system can also include a seventh channel in fluid communication with the first channel. The seventh channel can extend outward from the first channel such that the seventh channel fluidly couples the first channel with the portion of the mounting system configured to hold the electronic device. In some embodiments, the fourth channel is substantially parallel to at least one of the fifth channel, the sixth channel, and the seventh channel. Furthermore, the fourth channel can be substantially parallel to the fifth channel. As such, the fifth channel can be substantially parallel to the sixth channel, and the sixth channel can be substantially parallel to the seventh channel.

In some embodiments, the base comprises a first sidewall and a second sidewall. The second channel, the first sidewall, and the second sidewall can extend outward.

As well, in some embodiments, the first channel extends from a top opening to a bottom opening of the base. The top opening and the bottom openings can be located between the first wall and the second wall of the base.

Even still, in some embodiments, mounting systems can include an adapter slideably received by the base between the first wall and the second wall. In some embodiments, the adapter comprises an aperture. When the adapter is slideably received by the base between the first wall and the second wall, the aperture can be in fluid communication with the first channel and the second channel.

In some embodiments, the mounting system further includes adhesive configured to couple the base to the television. The first channel can be located between the adhesive and the base. The first channel can be located between the adhesive and the first wall, and the first channel can be located between the adhesive and the second wall.

As well, in some embodiments, the mounting system further comprises one or more legs coupled between the base and the adhesive. In some embodiments, the one or more legs comprise four legs. The second channel can extend along a first direction. As well, the one or more legs can extend along the first direction.

The disclosure also includes a mounting kit configured to couple an electronic device and a remote control to a television. The mounting kit can include a mount configurable to couple the electronic device to the television; and a remote holder configurable to couple the remote control to the television. The remote control can be communicatively coupled to the electronic device.

In some embodiments, the mount comprises adhesive configurable to couple the electronic device to a backside of the television. As well, in some embodiments, the remote holder comprises adhesive configurable to couple the electronic device to at least one of a side of the television and the backside of the television.

The electronic device can be a first electronic device having a first thickness. As well, in some embodiments, the kit can further include an adapter slideably received by the mount. The adapter can allow the mount to securely receive a second electronic device having a second thickness that is less than the first thickness.

The remote holder can be configurable to receive a charging cable such that when the remote holder receives the remote control the charging cable electrically couples with the remote control. The mount can be configurable to receive at least one of a power cable electrically coupled to the electronic device and a High-Definition Multimedia Interface cable communicatively coupled to the electronic device.

In some embodiments, the mounting kit further includes a cord management system configurable to guide at least one of the charging cable, the High-Definition Multimedia Interface cable, and the power cable. The cord management system can comprise adhesive configurable to couple the cord management system to the backside of the television. In some embodiments, the electronic device comprises a streaming media player and/or a gaming console. Accordingly, in some embodiments, the mounting kit further comprises a gaming controller configurable to be communicatively coupled to the gaming console. Even still, in some embodiments, the mounting kit further comprises an HDMI cable configurable to communicatively couple to the electronic device. The mount can be configurable to receive the HDMI cable.

The disclosure also includes a mounting kit configured to couple an electronic device and a cable to a television. The mounting kit can comprise a mount configurable to couple the electronic device to the television; and a cord management system configurable to guide the cable coupled to the electronic device.

In some embodiments, the mount comprises adhesive configurable to couple the electronic device to a backside of the television. As well, in some embodiments, the cord management system comprises adhesive configurable to couple the cord management system to the backside of the television.

The electronic device can be a first electronic device having a first thickness. The kit can further include an adapter slideably received by the mount. The adapter can allow the mount to securely receive a second electronic device having second thickness that is less than the first thickness.

BRIEF DESCRIPTION OF THE DRAWINGS

These and other features, aspects, and advantages are described below with reference to the drawings, which are intended to illustrate, but not to limit, the invention. In the drawings, like reference characters denote corresponding features consistently throughout similar embodiments.

FIG. 4 illustrates a top view of an embodiment of a mounting system, according to some embodiments.

FIG. 5 illustrates a front view of an embodiment of a mounting system, according to some embodiments.

FIG. 6 illustrates a right side view of an embodiment of a mounting system, according to some embodiments.

DETAILED DESCRIPTION

Figure 1:
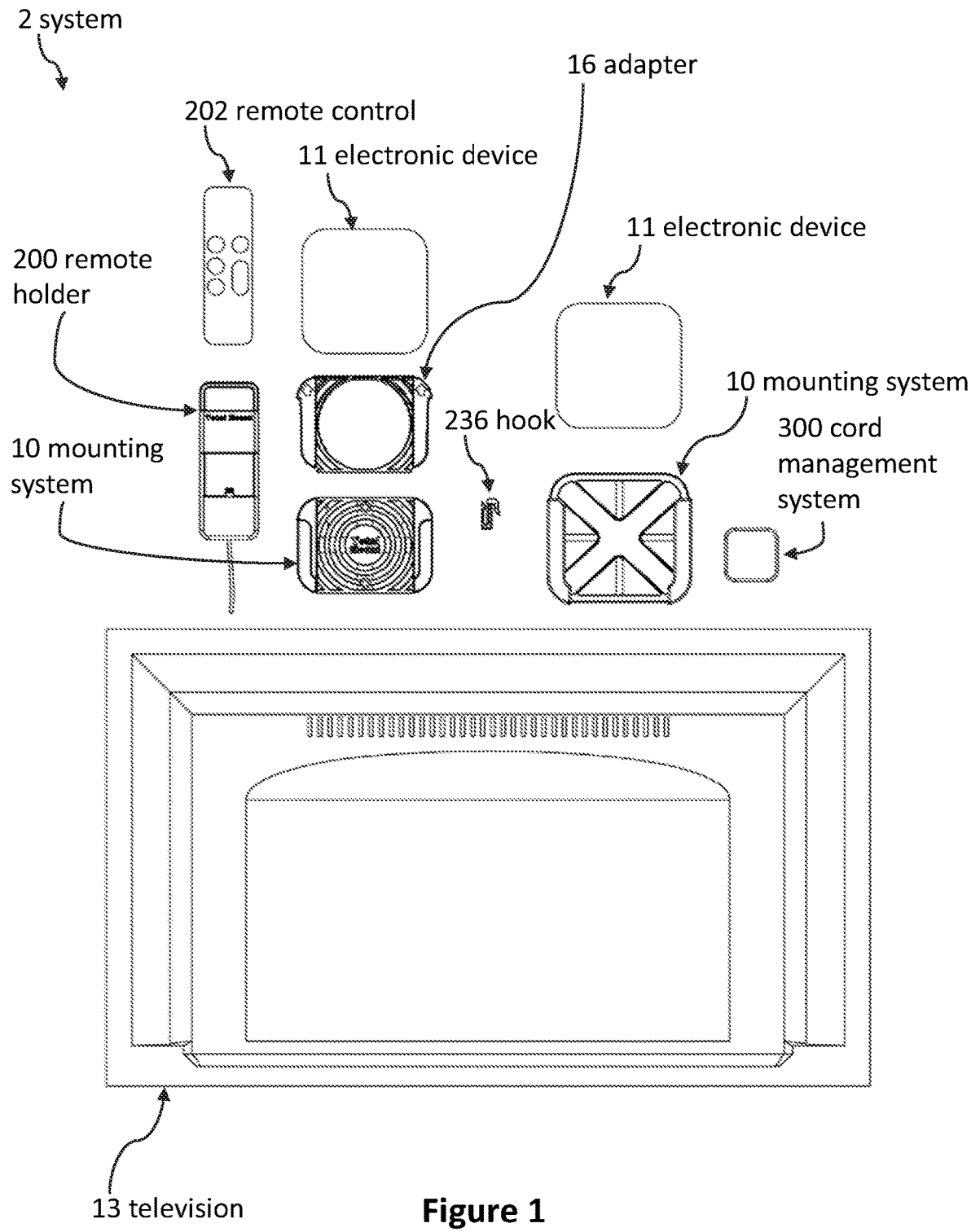
FIG. 1 illustrates a front view of an embodiment of the system, according to some embodiments.
Figure 2:
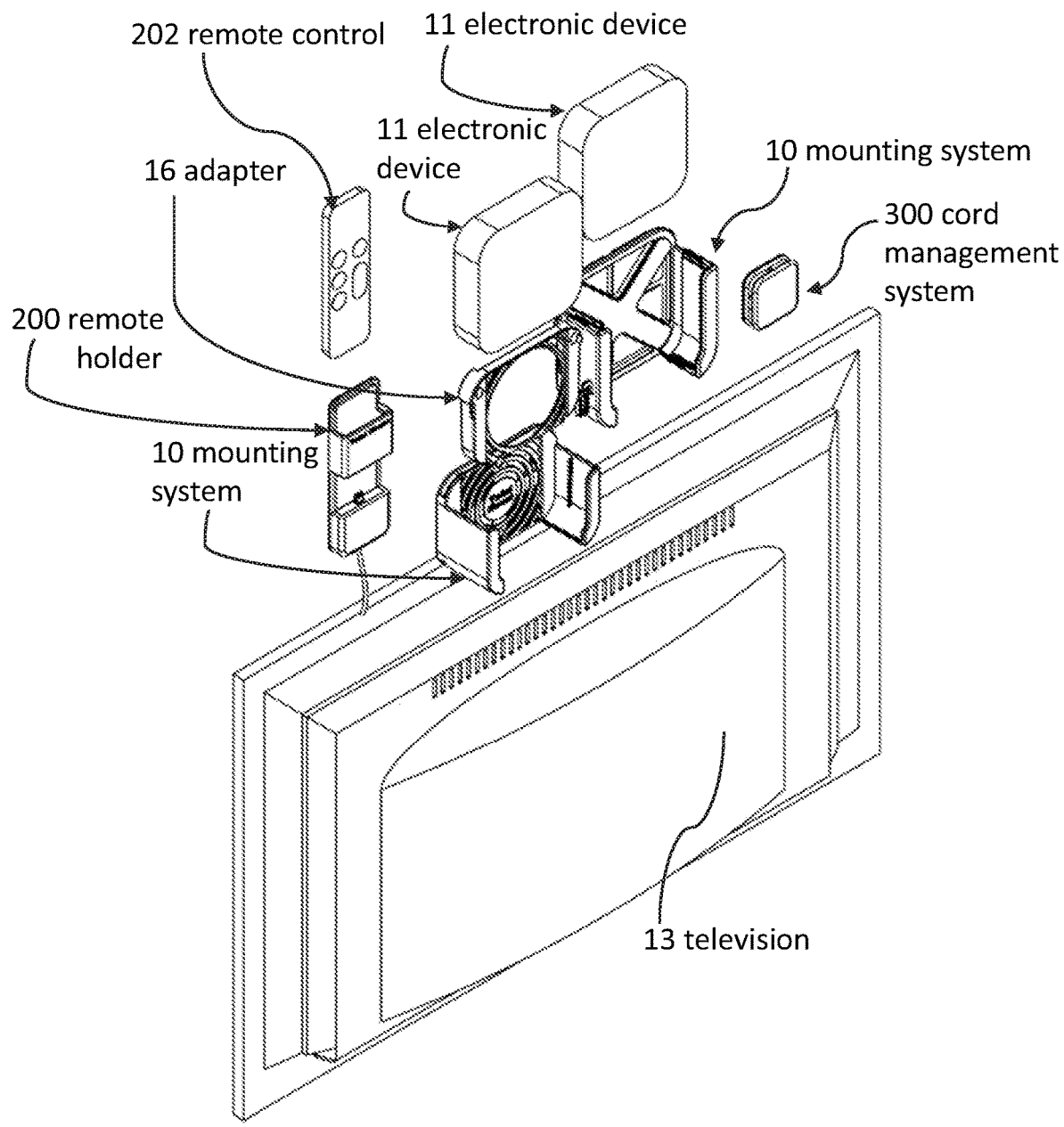
FIG. 2 illustrates a perspective view of an embodiment of the system, according to some embodiments.

Although certain embodiments and examples are disclosed below, inventive subject matter extends beyond the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components.

For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Electronic devices include many types of devices that send content (e.g., movies, TV shows) to televisions. Electronic devices can include Digital Video Disc (DVD) players, Blu-ray players, digital media extenders, and digital media players such as Apple TV (made by Apple, Inc.), Roku players (made by Roku, Inc.), and Amazon Fire TV (made by Amazon.com, Inc.).

Digital media players often transmit digital signals wirelessly or through a wire such as a High-Definition Multimedia Interface (HDMI) cable to a screen that displays an image based on the digital signal. Screens include computer monitors, televisions, and image-producing portions of movie projectors. Televisions include flat-panel displays, flat-screen televisions, and tube televisions.

Owners of digital media players may prefer to mount their digital media players near their screens. For example, a person who owns a flat screen television that is mounted on the wall might want to mount her Apple TV onto her flat screen television or onto the wall behind her flat screen television. Some embodiments described herein enable people to mount their digital media players to their televisions (e.g., to a backside of a television).

INDEX

This index provides general information that is applicable to some embodiments, but is not necessarily applicable to all embodiments. Some embodiments use different numbers and/or descriptions than are shown in this index.

2—System
10—Mounting system
11—Electronic device
12—Tray
13—Television
14—Base
15—Backside surface of television
16—Adapter
18—Large channel
20—Small channel
22—First sidewall
24—Second sidewall
26—Inward protrusion
30—Outward facing periphery
31—Inward facing periphery
32—Outer periphery
33—Inner periphery
34—Top portion
36—Bottom portion
38—Adhesive pad
40—Hook hole
42—Screw hole
50—First vertical channel
52—Second vertical channel
54—Horizontal channel
56—Leg
70—High-Definition Multimedia Interface (HDMI) cable
72—Power cable
73—Charging cable
74—Power outlet
78—First kit
80—Second kit
82—Third kit
84—Fourth kit
85—Gaming controller
86—Retracted position
88—Extended position
90—Overmold
92—First extension wall
94—Second extension wall
102—First retraction slot
104—First extension slot
106—First engaging portion
108—Second retraction slot
110—Second extension slot 112—Second engaging portion
114—Third retraction slot
116—Third extension slot
118—Third engaging portion
120—Fourth retraction slot
122—Fourth extension slot
124—Fourth engaging portion
236—Hook
414—First ramp
416—Second ramp
418—Third ramp
420—Fourth ramp
422—First angled surface
424—Second angled surface
520—First channel
522—First channel axis
524—Second channel
526—Second channel axis
528—Third channel
530—Third channel axis
532—Fourth channel
534—Fourth channel axis
536—Fifth channel
538—Fifth channel axis
540—Sixth channel
542—Sixth channel axis
544—Seventh channel
546—Seventh channel axis
600—Remote holder
602—Remote control
700—Cord management system
X—First direction
Y—Second direction
Z—Third direction Mounting Systems for Digital Media Players The disclosure includes various mounting systems 10 for mounting electronic devices 11 (e.g. digital media players) to various surfaces (e.g. a backside surface of a television 13, a wall of a building, etc.). In some embodiments, a mounting system 10 is configurable to couple an electronic device 11 to a television 13. The mounting system 10 can include a base 14 configured to hold the electronic device 11 such that a portion of the base 14 is located between the television 13 and the electronic device 11. In some embodiments, the base 14 comprises and a top portion 34 and a bottom portion 36. In some embodiments, the mounting system 10 comprises a first sidewall 22 and a second sidewall 24 that extend outward away from the base 14. As illustrated in FIGS. 4 and 5, the first sidewall 22 and the second sidewall 24 can be located at opposite sides of the base 14.

Figure 19:
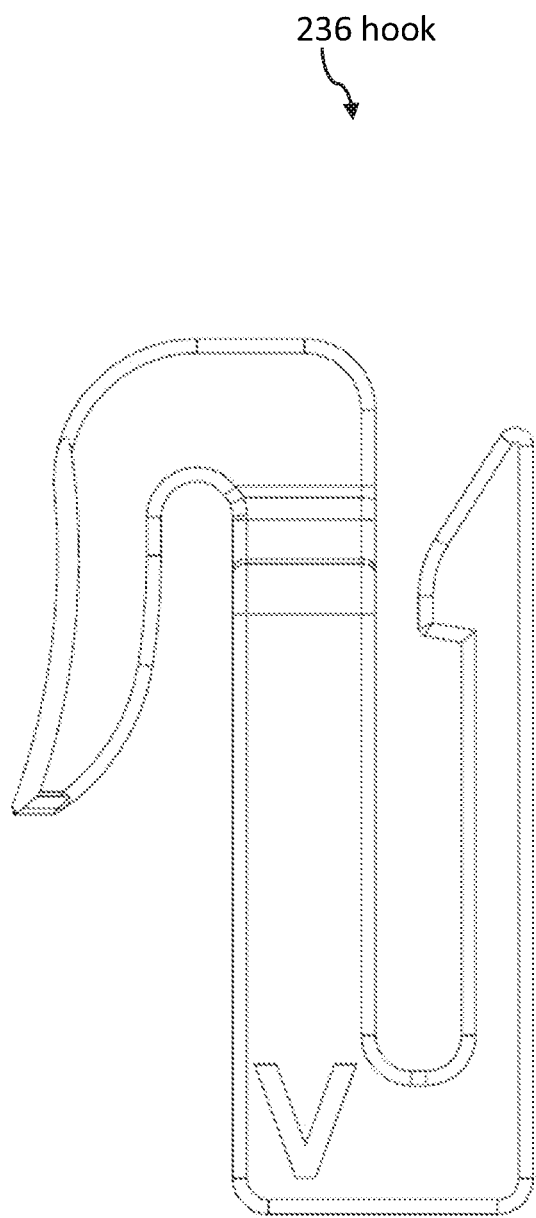
FIG. 19 illustrates a side view of an embodiment of a hook, according to some embodiments.

The mounting systems 10 can also be coupled to walls (e.g., a wall of an electronic display such as a television 13) via adhesive 38, such as adhesive pads made by 3M Company, which has offices in St. Paul, Minn. The mounting systems 10 can also be coupled to walls and various surfaces via screws (not shown) and hooks 236 (as shown in FIG. 19). For example, the mounting systems 10 described herein can use the hooks 236 as described in U.S. Provisional patent application Ser. No. 14/169,148.

The mounting systems 10 can be molded from acrylonitrile butadiene styrene ("ABS"). In some embodiments, surfaces of the mounting systems 10 that may touch portions of the electronic device 11 (e.g. media player) are overmolded with a softer material, which can be a thermoplastic elastomer ("TPE").

Figure 9:
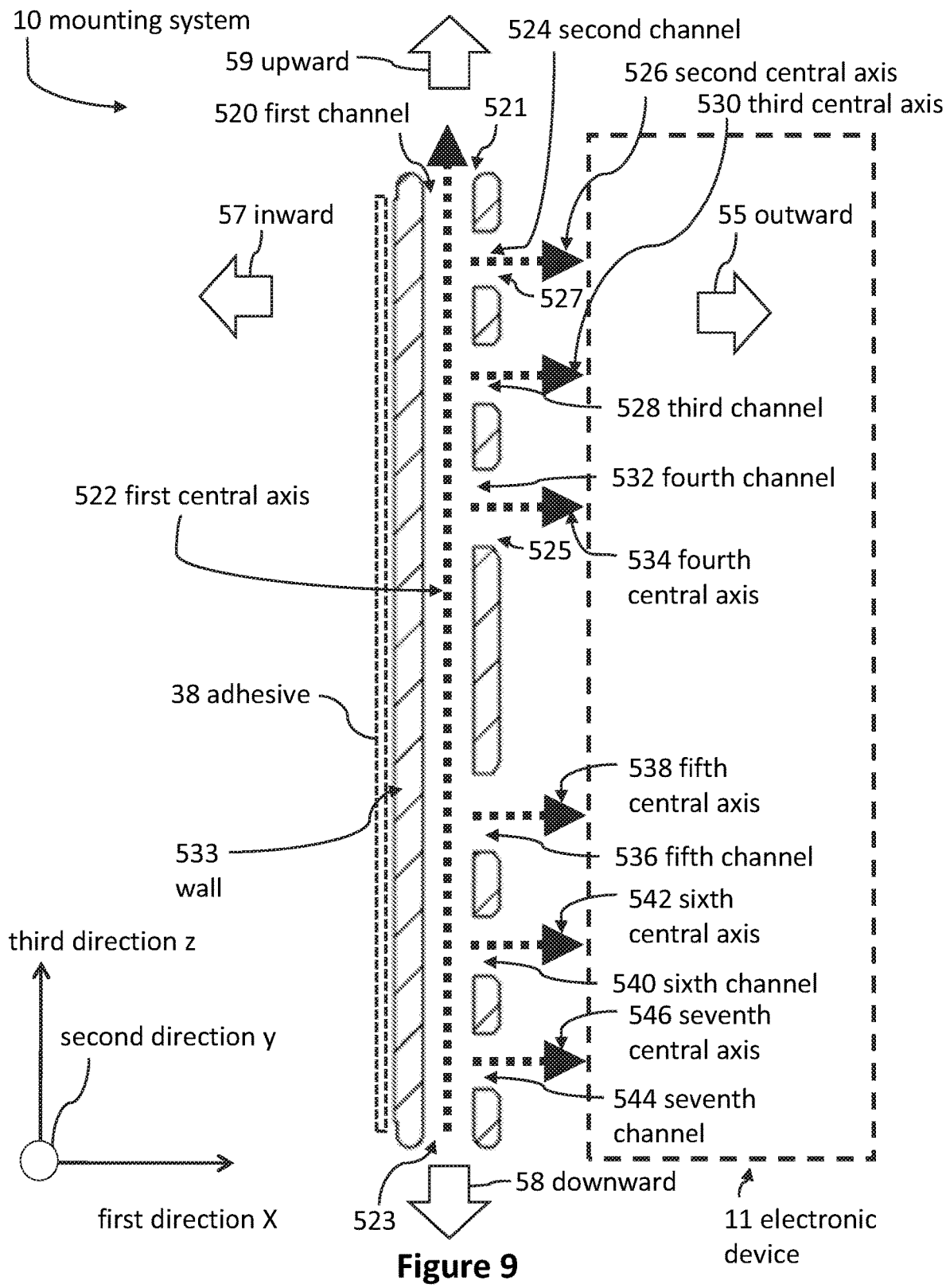
FIG. 9 illustrates a slice-sectional view along line B-B from FIG. 7, according to some embodiments.

Some mounting systems 10 can include at least one channel that passes through an internal portion of the mounting system 10 to thereby provide airflow to the electronic device 11. The channels can allow air to flow to the electronic device 11 to prevent the electronic device 11 from getting too hot during use. With reference to FIG. 9, mounting systems 10 can include a first channel 520 located between a first wall 22 and a second wall 24 of the base 14 and a second channel 524 in fluid communication with the first channel 520. The first channel 520 can continue along a third direction Z from the bottom portion 36 to the top portion 34 of the base 14. As well, the second channel 524 can extend outward from the first channel 520 such that the second channel 524 fluidly couples the first channel 520 with a portion of the mounting system 10 configured to hold the electronic device 11. In this regard, the second channel 524 can extend along a first direction X.

Figure 3:
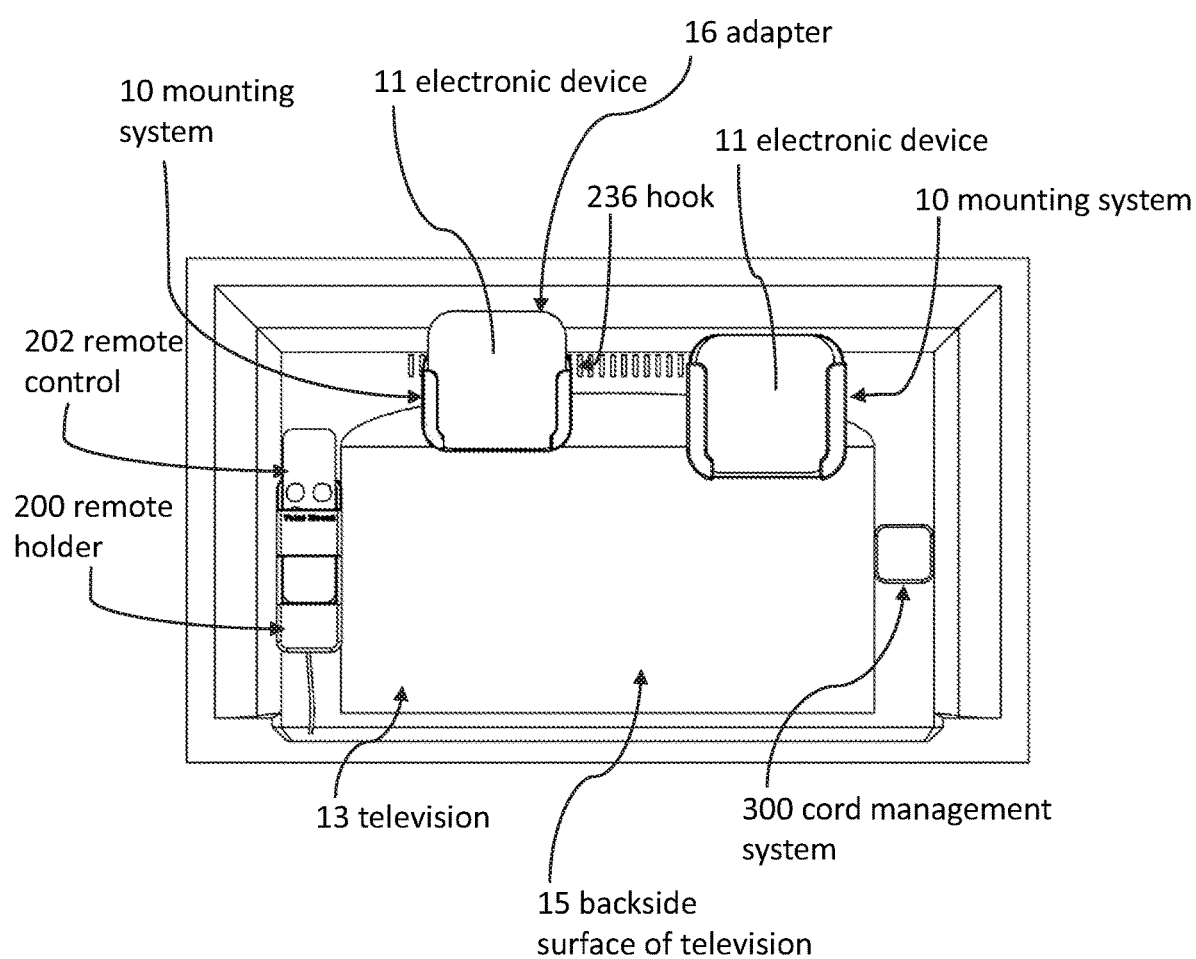
FIG. 3 illustrates a front view of an embodiment of the system, according to some embodiments.
Figure 7:
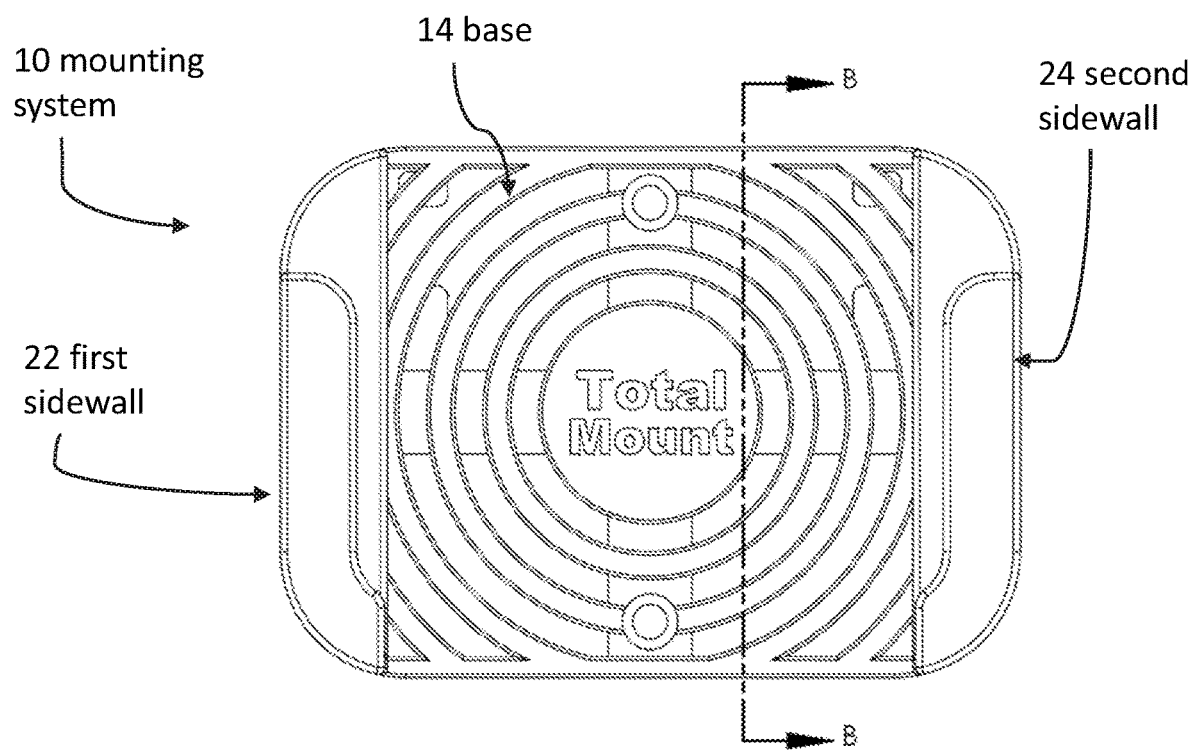
FIG. 7 illustrates a front view of an embodiment of a mounting system, according to some embodiments.
Figure 8:
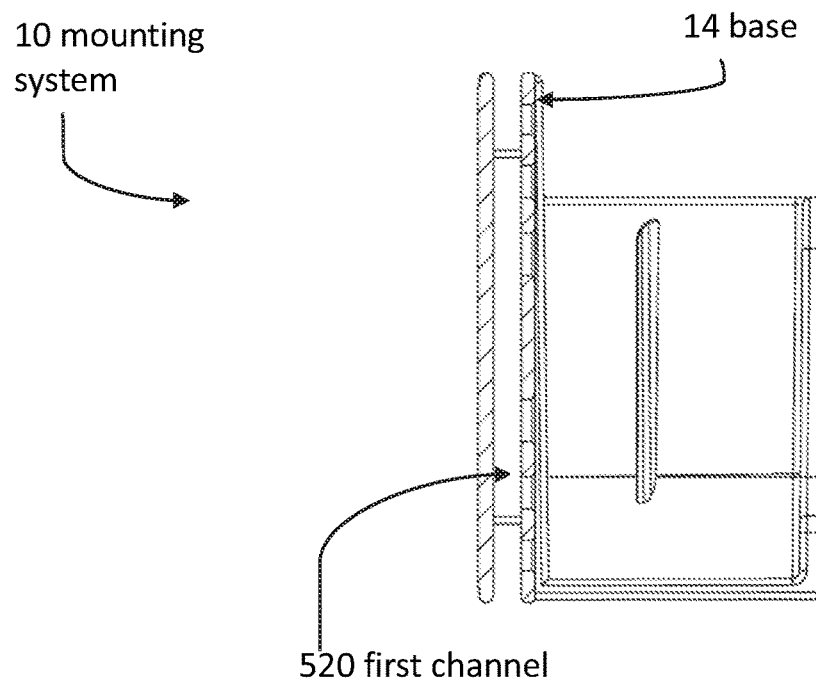
FIG. 8 illustrates a cross-sectional view along line B-B from FIG. 7, according to some embodiments.

FIG. 9 illustrates outward direction 55 and inward direction 57 (as indicated by the arrows in FIG. 9). The outward direction 55 is away from the adhesive 38 towards a portion of the mounting system 10 configured to hold an electronic device 11. The inward direction 57 is away from the adhesive 38 and is opposite to the outward direction 55. The outward direction 55 is away from a surface to which the mounting system 10 is coupled (e.g., via the adhesive 38). The inward direction 57 is towards the surface to which the mounting system 10 is coupled. In the context of FIG. 3, the inward direction 57 is towards the television 13 and the outward direction 55 is away from the television 13.

FIG. 9 illustrates a downward direction 58, which is perpendicular to the outward direction 55. FIG. 9 also illustrates an upward direction 59, which is perpendicular to the outward direction 55. As shown in FIG. 9, the first channel 520 extends from a first opening 521 (that faces upward) to second opening 523 (that faces downward). The vertical dashed arrow in FIG. 9 indicates the first ventilation channel 520. The horizontal (outward) dashed arrows in FIG. 9 indicate ventilation channels 524, 528, 532, 536, 540, 544 that face outward, are in fluid communication with the first ventilation channel 520, and are in fluid communication with a portion of the mounting system 10 that holds the electronic device 11.

FIGS. 4 and 9 illustrates an anchor wall 533 oriented parallel to the base (and within plus or minus 30 degrees of parallel to the base) and coupled to the base 14 (labeled in FIG. 4) by at least one connecting protrusion 27 that protrudes inward from the base 14 to the anchor wall 533. An adhesive 38 is coupled to the anchor wall 533 and is configured to couple the mounting system 10 to a wall, such as the wall of a television 13 (shown in FIG. 3).

As used herein, an "anchor wall" is a wall having adhesive 38 that is used to couple the mounting system 10 to a mounting surface. The anchor wall 533 can be molded plastic. Adhesive 38 can be bonded to the anchor wall 533.

As shown in FIG. 9, the mounting system 10 comprises an outward direction 55, a first opening (e.g. 525 or 527) and a second opening (e.g., 521 or 523). The first opening (e.g. 525 or 527) faces outward, the second opening (e.g., 521 or 523) faces perpendicular to the outward direction, and the first ventilation channel 520 and the second ventilation channel (e.g., 524 or 532) fluidly couple the first opening (e.g. 525 or 527) to the second opening (e.g., 521 or 523) such that the mounting system 10 is configured to enable air heated by the electronic device 11 to enter the first opening (e.g. 525 or 527) in an inward direction 57, pass through the second ventilation channel (e.g., 524 or 532), pass through the first ventilation channel 520, and then exit the second opening (e.g., 521 or 523).

In some embodiments, the first channel 520 continues from a bottom portion 36 of the base 14 to a top portion 34 of the base 14. As such, the bottom portion 36 can include a first open end configured to provide access to electrical ports of the electronic device 11, while the top portion 36 can include a second open end. Some embodiments can also include a third channel 528 in fluid communication with the first channel 520. The third channel 528 can extend outward from the first channel 520 such that the third channel 528 fluidly couples the first channel 520 with the portion of the mounting system 10 configured to hold the electronic device 11. In this regard, the third channel 528 can extend along the first direction X.

Figure 22:
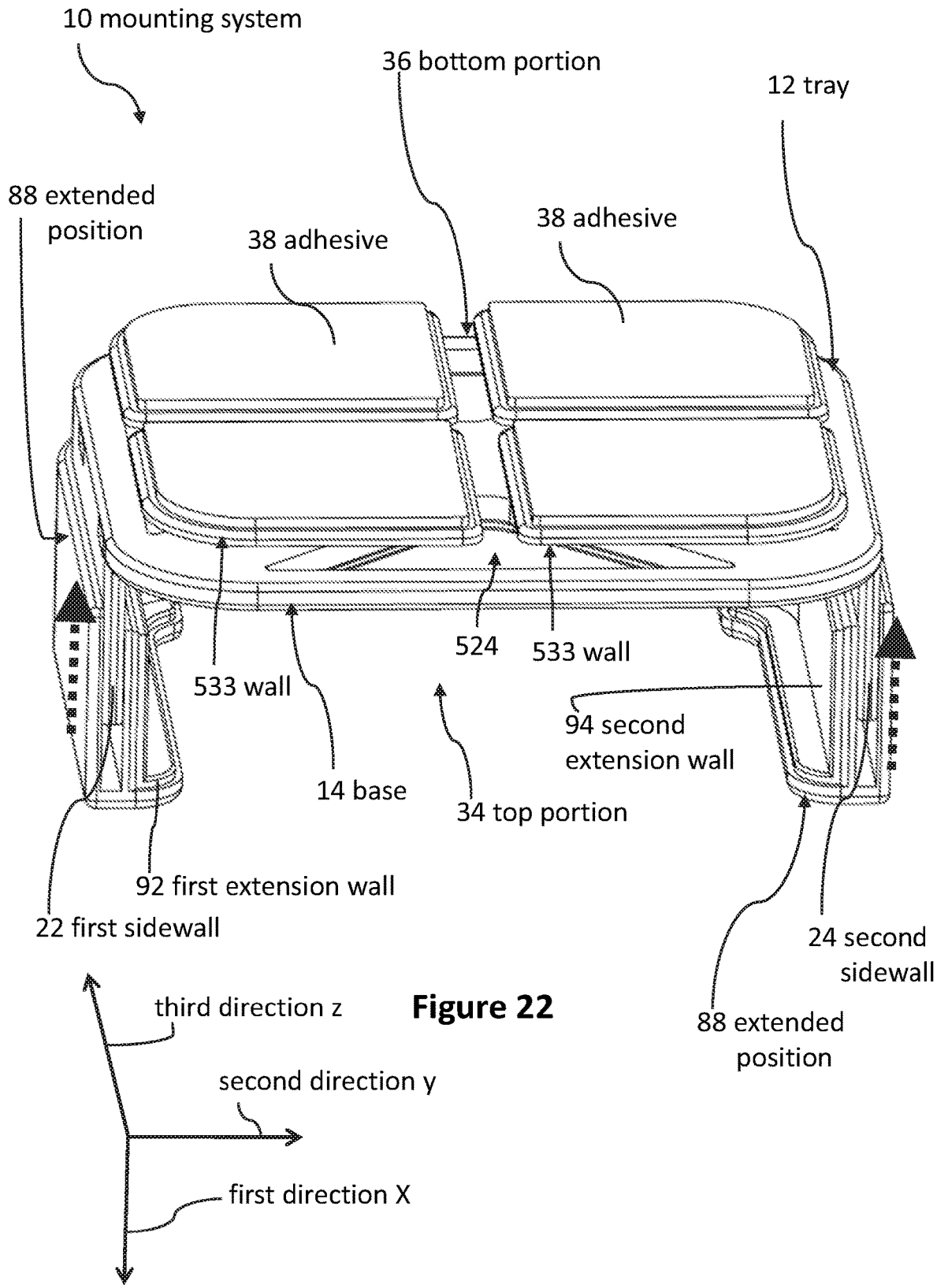
FIG. 22 illustrates a top perspective view of an embodiment of a mounting system, according to some embodiments.
Figure 23:
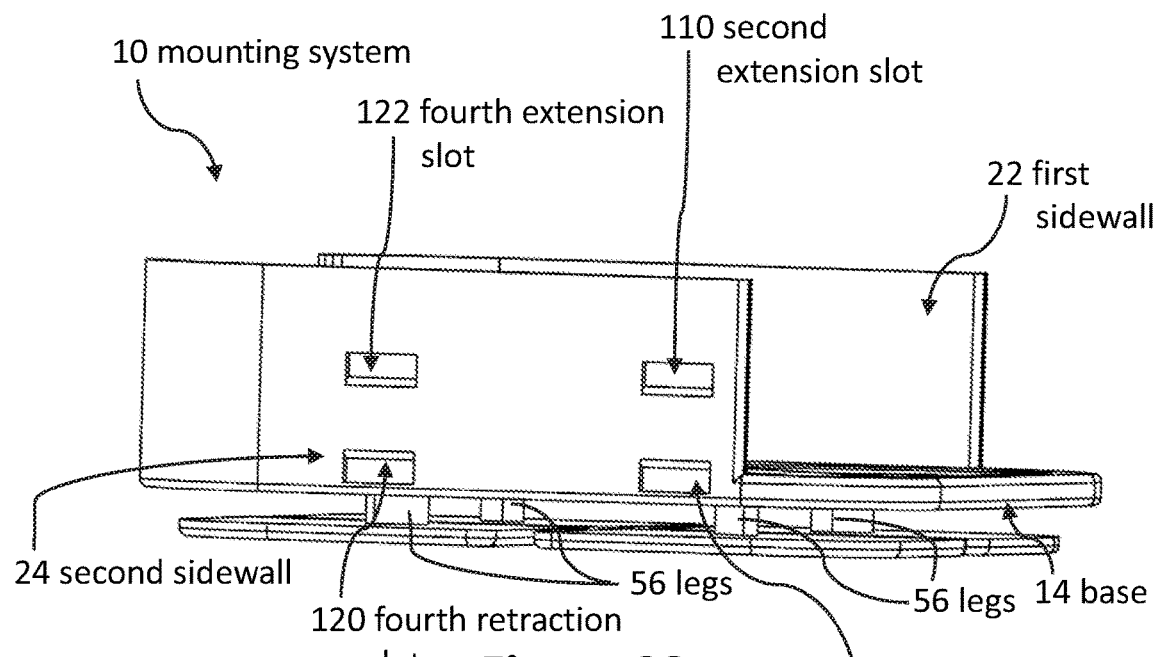
FIG. 23 illustrates a first side perspective view of an embodiment of a mounting system, according to some embodiments.

With continued reference to FIGS. 9, 22 and 23, the mounting system 10 can further comprise an adhesive 38 configured to couple the base 14 to the television 13. As shown in FIGS. 22 and 23, in some embodiments, the adhesive 38 is coupled to the base 14 via one or more legs 56. The one or more legs 56 can extend along the first direction X to thereby offset the adhesive 38 from the base 14. It should be appreciated that the mounting system 10 can include any number of legs 56, such as one, two, three, four, and even five or more legs 56.

In some embodiments, the first channel 520 is located between the adhesive 38 and the base 14 along the first direction X. As well, the first channel 520 can be located between the one or more legs 56 and the base 14 along the first direction X. In some embodiments, the first channel 520 is located between the adhesive 38 and the first wall 22 along the first direction X. Even still, in some embodiments, the first channel 520 is located between the adhesive 38 and the second wall 24 along the first direction X.

Various embodiments of the mounting system 10 can dispose the first channel 520 at various locations along the first direction X. For example, when the electronic device 11 is coupled to the mounting system 10, the first channel 520 can be located between the adhesive 38 and the electronic device 11. As well, the first channel 520 can be located between the base 14 and the electronic device 11 along the first direction X.

In some embodiments, the mounting system 10 can include additional channels. For example, some mounting systems 10 can include a fourth channel 532 in fluid communication with the first channel 520. The fourth channel 532 can extend outward from the first channel 520 such that the fourth channel 532 fluidly couples the first channel 520 with the portion of the mounting system 10 configured to hold the electronic device 11. The fourth channel 532 can extend along a fourth central axis 534, which can extend along the first direction X.

As well, some mounting systems 10 can include a fifth channel 536 in fluid communication with the first channel 520. The fifth channel 536 can extend outward from the first channel 520 such that the fifth channel 536 fluidly couples the first channel 520 with the portion of the mounting system 10 configured to hold the electronic device 11. The fifth channel 536 can extend along a fifth central axis 538, which can extend along the first direction X.

Even still, some mounting systems 10 can even include a sixth channel 540 in fluid communication with the first channel 520. The sixth channel 540 can extend outward from the first channel 520 such that the sixth channel 540 fluidly couples the first channel 520 with the portion of the mounting system 10 configured to hold the electronic device 11. The sixth channel 540 can extend along a sixth central axis 542, which can extend along the first direction X.

Some mounting systems 10 can even include a seventh channel 544 in fluid communication with the first channel 520. The seventh channel 544 can extend outward from the first channel 520 such that the seventh channel 544 fluidly couples the first channel 520 with the portion of the mounting system 10 configured to hold the electronic device 11. The seventh channel 544 can extend along a seventh central axis 546, which can extend along the first direction X.

In some embodiments, the fourth channel 532 can be substantially parallel to at least one of the fifth channel 536, the sixth channel 540, and the seventh channel 544. As well, in some embodiments, the fourth channel 532 is substantially parallel to the fifth channel 536, the fifth channel 536 is substantially parallel to the sixth channel 540, and the sixth channel 540 is substantially parallel to the seventh channel 544.

The first channel 520 can extend from a top opening to a bottom opening of the base 14. In some embodiments, the top opening and the bottom opening are located between the first wall 22 and the second wall 24 of the base 14.

Even still, in various embodiments, the first channel 520 and the additional channels can be disposed in various locations along the mounting system 10. In this regard, the first channel 520 and any additional channels can be configured to provide airflow to specific locations of the electronic device 11, when the electronic device 11 is coupled to the mounting system 10. For example, the second, third, fourth, fifth, sixth, and/or seventh channel 524, 528, 532, 536, 540, 544 can be disposed at any angle with respect to the first channel 520. As such, the second, third, fourth, fifth, sixth, and/or seventh channel 524, 528, 532, 536, 540, 544 can be disposed at angles that allow the various channels to be aimed at specific locations on the electronic device 11. For example, in some embodiments, the second, third, fourth, fifth, sixth, and/or seventh channel 524, 528, 532, 536, 540, 544 are disposed perpendicular with respect to the first channel 520. In other embodiments, the second, third, fourth, fifth, sixth, and/or seventh channel 524, 528, 532, 536, 540, 544 are not perpendicular with respect to the first channel 520.

In some embodiments, a first central axis 522 of the first channel 520 can be within plus or minus twenty degrees of a plane of the adhesive 38. As well, the second channel 524 and the third channel 528 can be within plus or minus forty degrees of being perpendicular to the first central axis 522 of the first channel 520. Even still, a second central axis 526 of the second channel 524 can be within plus or minus thirty degrees of a third central axis 530 of the third channel 528. In some embodiments, the third central axis 530 of the third channel 528 is substantially parallel to the second central axis 526 of the second channel 524.

As shown in FIGS. 10-19, mounting systems 10 can be configured to accommodate electronic devices 11 of different sizes, such as electronic devices 11 of different thicknesses. In some embodiments, a mounting system 10 is configurable to couple an electronic device (e.g. a streaming media player, gaming console, cable box, and the like) to a television 13.

Figure 11:
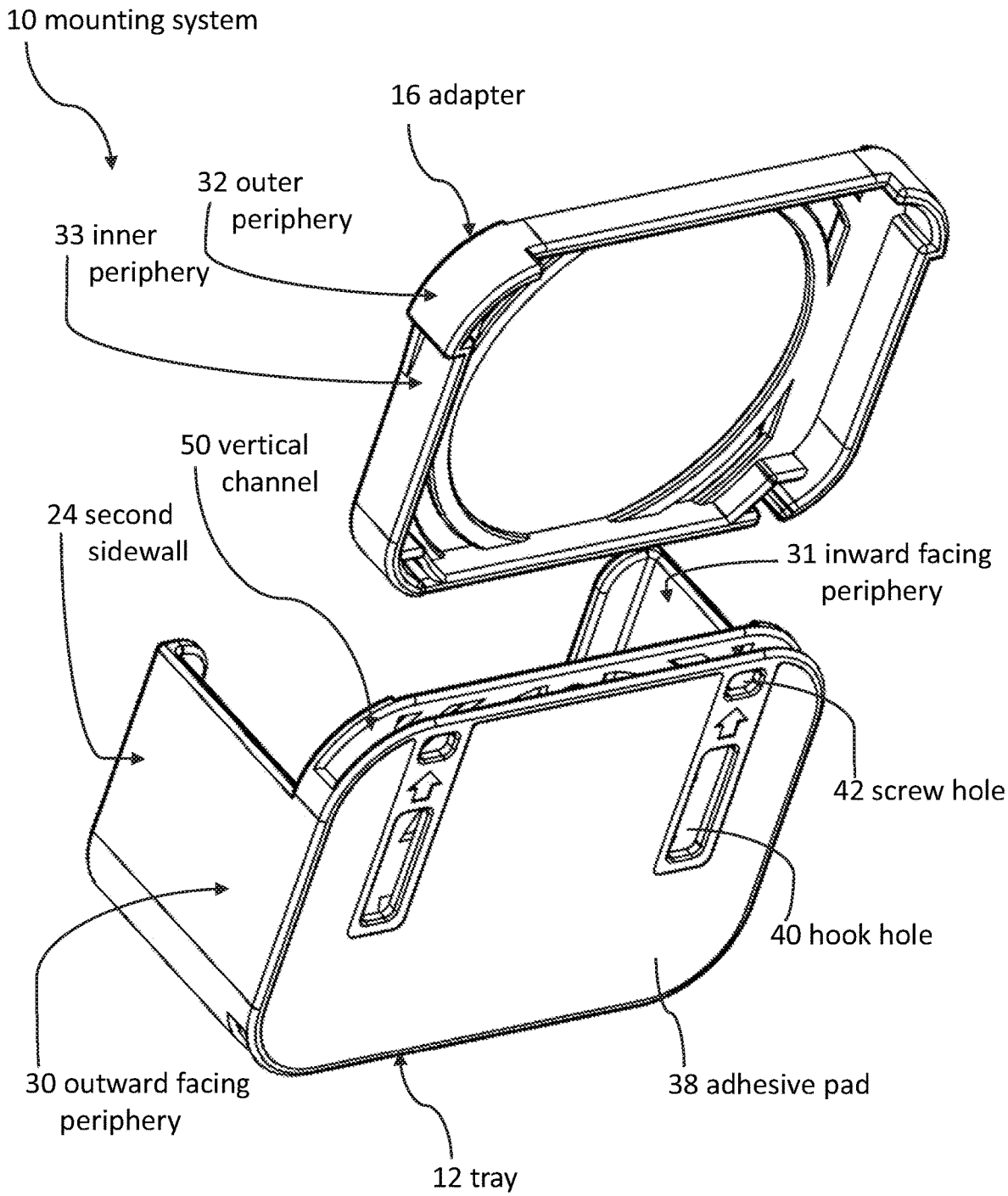
FIG. 11 illustrates a back perspective view of an embodiment of the mounting system, according to some embodiments.
Figure 12:
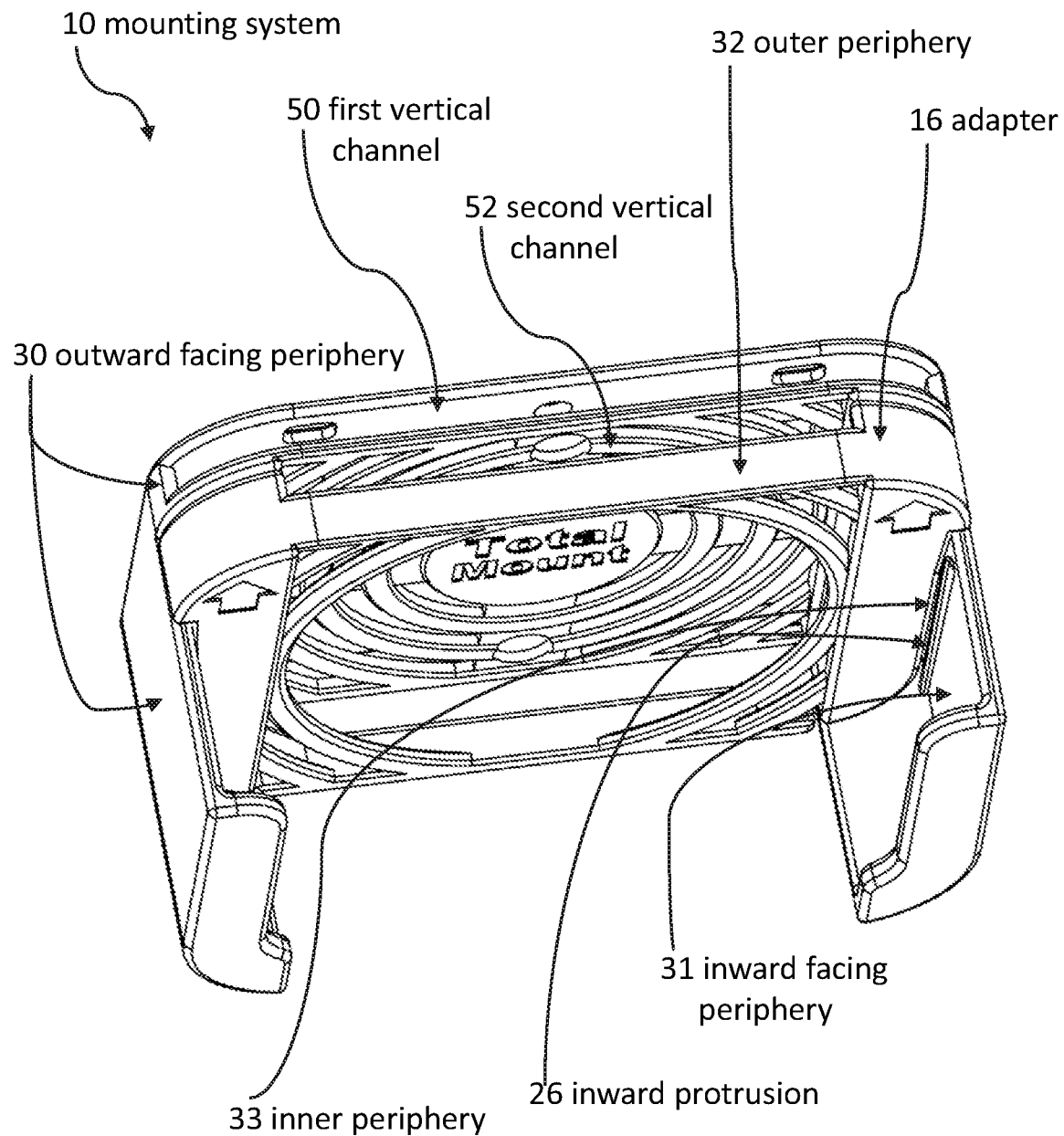
FIG. 12 illustrates a top perspective view of an embodiment of the mounting system, according to some embodiments.

The mounting system 10 can be attached to any surface, such as a wall or television 13 (e.g. a backside surface of a television 13). As shown in FIG. 11, the mounting system 10 can include various attachment features. In some embodiments, the mounting system 10 includes at least one hook hole 40, at least one screw hole 42, and/or an adhesive (e.g. an adhesive pad 38) located along a backside of the base 14.

A first side of the adhesive pad 38 can be adhesively attached to the backside of the base 14, while the second side of the adhesive pad 38, which is opposite the first side of the adhesive pad 38, can be adhesively attached to any surface, such as a backside of the television 13, and the like. In some embodiments the adhesive pad 38 is about 1 millimeter thick. In some embodiments, the adhesive pad 38 is about 0.045 inches thick. Generally, it should be appreciated that the adhesive pad 38 can define any thickness greater than 0.045 inches, or any thickness less than 0.045 inches.

As well, the at least one hook hole 40 can be configured to receive a first end of a hook 236 (as shown in FIG. 17), such as the hooks described in U.S. patent application Ser. No. 13/278,759, filed Oct. 21, 2011, and entitled MOUNTING SYSTEM FOR DIGITAL MEDIA PLAYERS. The entire contents of U.S. patent application Ser. No. 13/278,759 are incorporated by reference herein. A second end of the hook 236 can thereby engage an opening along the television 13, such as an air vent located along a backside of the television 13, to thereby couple the mounting system 10 to the television 13. Even still, the screw hole 42 can be an aperture that receives a screw, which can be threadably attached to a surface, such as a wall or television 13, to thereby attach the mounting system 10 to the surface.

The mounting system 10 can include a base 14 configured to hold the electronic device 11. As well, the mounting system 10 can include a first sidewall 22 that extends from a first side of the base 14 along a first direction X that points away from the television 13. The mounting system 10 can also include a second sidewall 24 that extends from a second side of the base 14 along the first direction X. It should be appreciated that the first side can be opposite the second side. The second sidewall 24 can be spaced from the first sidewall 22 along a second direction Y that is perpendicular to the first direction X.

In order to receive electronic devices 11 of different sizes, the mounting system 10 can include an adapter 16 received (e.g. removably coupled) between the first sidewall 22 and the second sidewall 24. In some embodiments, the adapter 16 can be slideably received by the tray 12 along a third direction Z that is perpendicular to the first direction X and the second direction Y. In some embodiments, the tray 12 can receive the adapter along a mating direction, other than the third direction Z, such as the first direction X or even the second direction Y.

Figure 10:
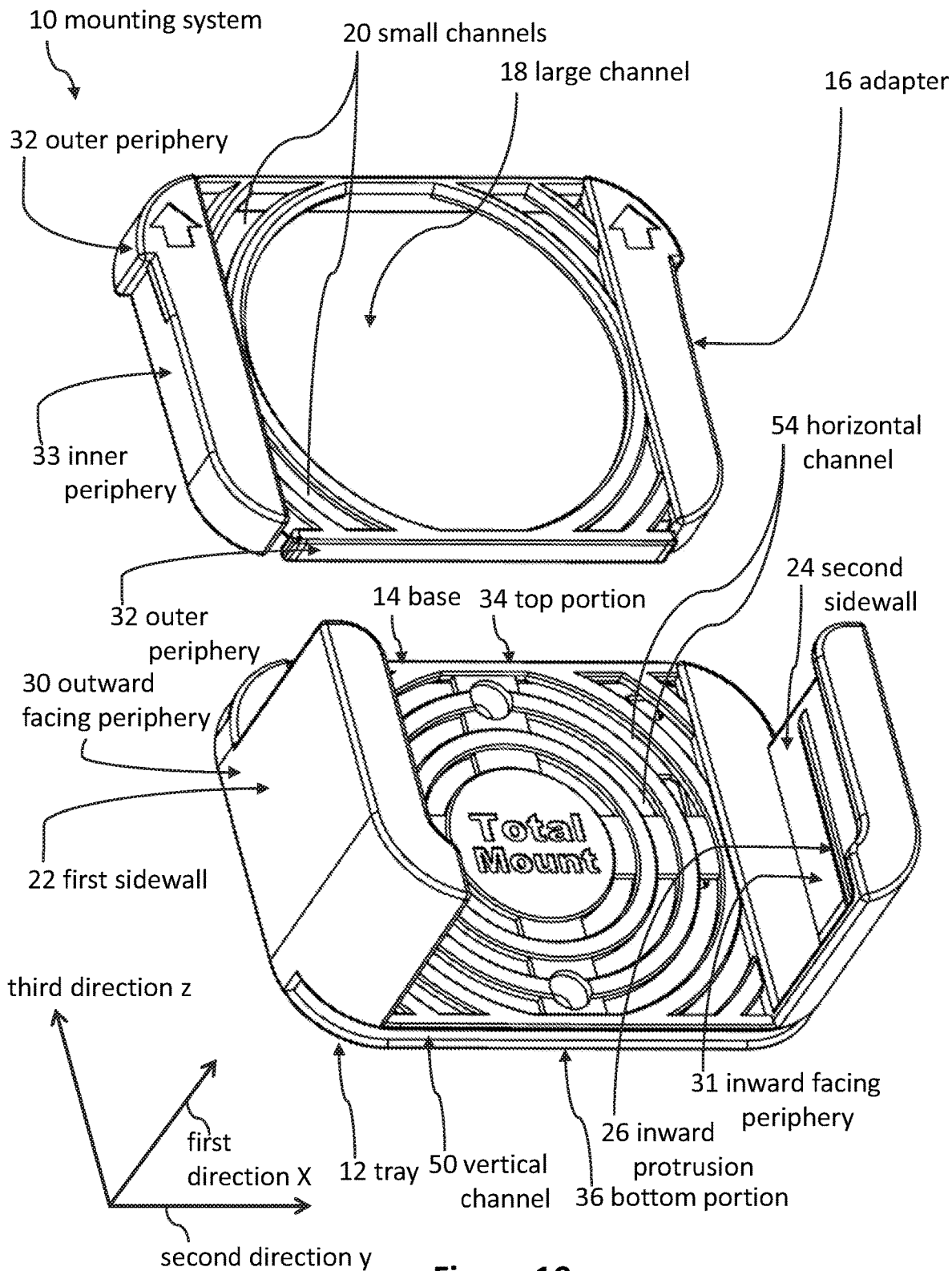
FIG. 10 illustrates a front perspective view of an embodiment of the mounting system, according to some embodiments.
Figure 13:
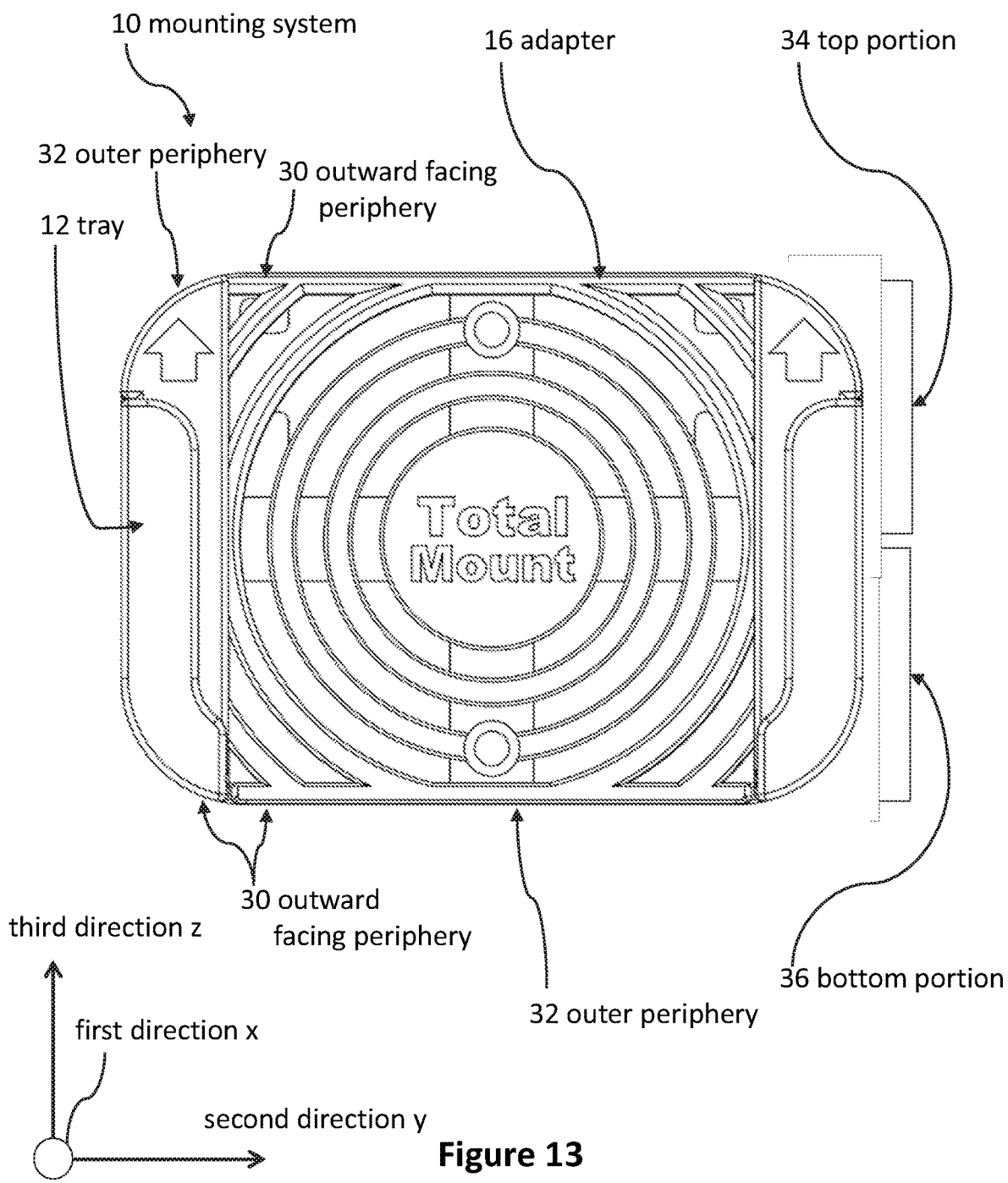
FIG. 13 illustrates a front view of an embodiment of the mounting system, according to some embodiments.

When the mounting system 10 receives the electronic device 11 and is attached to a television 13, a portion of the base 14 can be located between the television 13 and the electronic device 11. As shown in FIGS. 10 and 13, the tray 12 can include a top portion 34 and a bottom portion 36 that is located opposite the top portion 34. The top portion 34 can be spaced from the bottom portion 36 along a third direction Z that is perpendicular to the first direction X and the second direction Y.

In some embodiments, the first sidewall 22 extends from the top portion 34 to the bottom portion 36 of the tray 12, and the second sidewall 24 extends from the top portion 34 to the bottom portion 36 of the tray 12. The first sidewall 22 and the second sidewall 24 can be configured to slideably receive the electronic device 11 at the top portion 34 of the tray 12. As well, the first sidewall 22 and the second sidewall 24 can be configured to retain the electronic device 11 at the bottom portion 36 of the base 14. For example, a bottom portion of the first sidewall 22 and a bottom portion of the second sidewall 24 can curve inward such that the bottom portion of the first sidewall 22 faces the bottom portion of the second sidewall 24 to thereby retain the electronic device 11 from moving along the third direction Z.

Portions of the first and second sidewalls 22, 24 can also extend along the second direction Y to provide additional support for retaining (i.e. securing) the electronic device 11. In some embodiments, a portion of the first sidewall 22 extends along the second direction Y towards the second sidewall 24. As well, a portion of the second sidewall 24 can extend along the second direction Y towards the first sidewall 22. In this manner, the portions of the first and second sidewalls 22, 24 can wrap around a surface of the electronic device 11.

Furthermore, in some embodiments, the first sidewall 22 and the second sidewall 24 are located along at least one of a top portion 34 of the tray 12 and a bottom portion 36 of the tray 12. In some embodiments, the first sidewall 22 and/or the second sidewall 24 are elongate along the third direction Z whereby the first and second sidewalls 22, 24 continuously extend from the top portion 34 to the bottom portion 36 of the tray 12. In this regard, a portion of the first sidewall 22 and a portion of the second sidewall 24 each can be disposed along a middle portion of the tray 12 that is located between a top portion 34 and a bottom portion 36 of the tray 12.

In some embodiments, the first and second sidewalls 22, 24 are not continuous between the top portion 34 and the bottom portion 36. The first sidewall 22 and the second sidewall 24 might each comprise one or more segments that are not adjoined along the third direction Z. For example, the first sidewall 22 and the second sidewall 24 might each contain one or more posts to retain the electronic device 11 and the adapter 16.

The first sidewall and the second sidewall can be configured to receive a first electronic device having a first thickness. As well, the first sidewall and the second sidewall can be configured to simultaneously receive a second electronic device having a second thickness and the adapter having a third thickness. In some embodiments, the first thickness is greater than the second thickness. As well, in some embodiments, the first thickness is substantially equal to the second thickness plus the third thickness. Even still, in some embodiments, the first thickness is about 1.4 inches thick, the second thickness is about 0.9 inches thick, and the third thickness is about 0.5 inches thick. Moreover, the electronic device 11 can define a length of about 3.9 inches and a width of about 3.9 inches.

The adapter 16 can be coupled to or removed from the mounting system 10 to thereby accommodate different thickness electronic devices 11. For example, the adapter 16 can be removed from the mounting system 10 to thereby allow thicker electronic devices 11 having a first thickness to securely fit between the base 14 and the first and second walls 22, 24 of the mounting system 10. Likewise, when the adapter 16 is received by the mounting system 10, thinner electronic devices 11 having a second thickness may securely fit between the base 14 and the first and second sidewalls 22, 24 of the mounting system 10. It should be appreciated that the adapter allows the thicker and thinner electronic devices 11 to be securely fit with respect to the first direction X. In other words, the electronic devices will be substantially fixed with respect to the first direction X. As well, it should be appreciated that the first thickness is greater than the second thickness. In some embodiments, the first thickness is 0.5 inches thicker than the second thickness. In some embodiments, the first thickness is less than 0.5 inches thicker than the second thickness, while in some embodiments, the first thickness is greater than 0.5 inches thicker than the second thickness.

As well, the first sidewall 22 and the second sidewall 24 can include various features to securely retain the adapter 16 in place within the mounting system 10. As shown in FIGS. 10, 12, 14, and 15, the mounting system 10 can include a first inward protrusion 26a that extends from an inward surface (or inner periphery 32) of the first sidewall 22, and a second inward protrusion 26b that extends from an inward surface (or inner periphery 32) of the second sidewall 24. The first inward protrusion 26a and the second inward protrusion 26b can extend along the second direction Y. In some embodiments, the first inward protrusion 26a and the second inward protrusion 26b extend toward each other along the second direction Y. In this regard, the first inward protrusion 26a can face the second inward protrusion 26b.

In some embodiments, the first sidewall 22 and the second sidewall 24 can be configured to receive a first electronic device 11a having a first thickness. As well, the first sidewall 22 and the second sidewall 24 can be configured to receive both a second electronic device 11b having a second thickness and the adapter having a third thickness. In this manner, the first thickness can be greater than the second thickness. As well, the first thickness can be substantially equal to the second thickness plus the third thickness.

Figure 14:
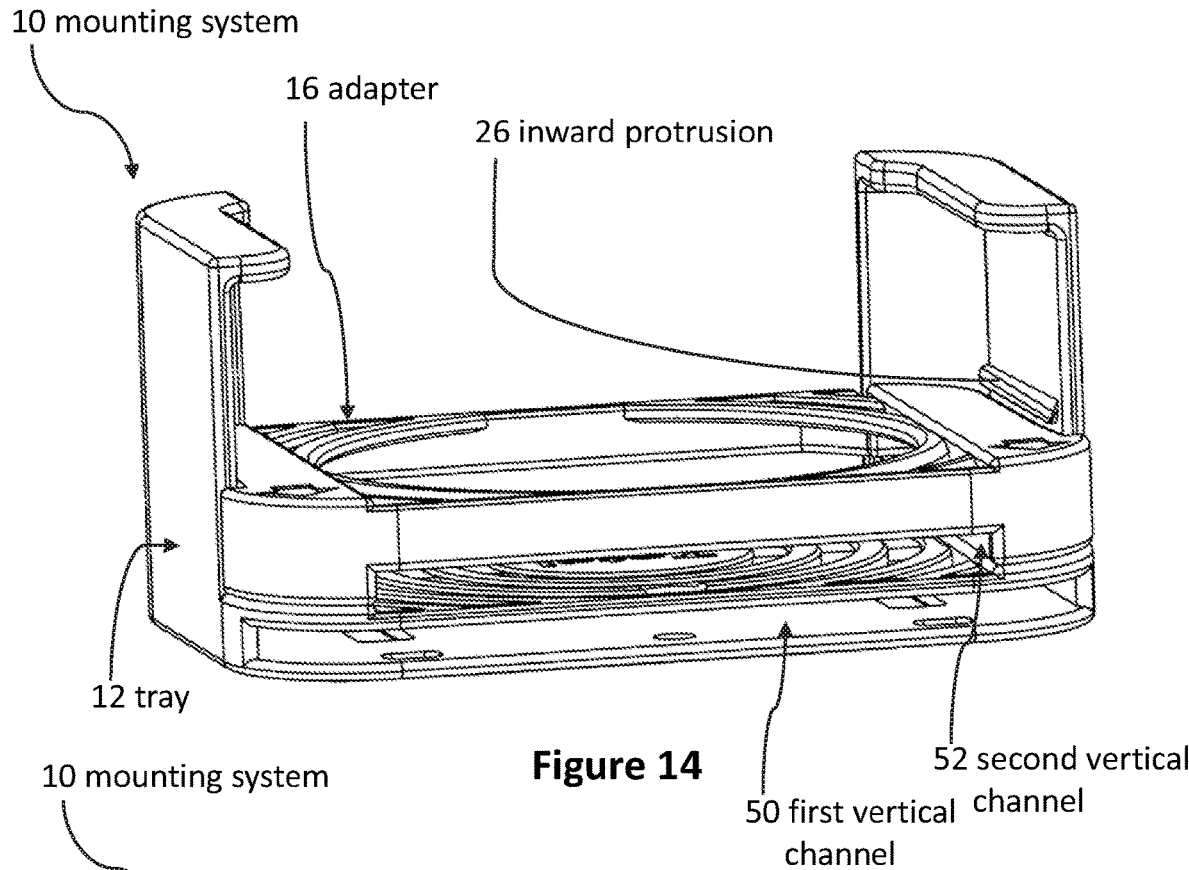
FIG. 14 illustrates a first top perspective view of an embodiment of the mounting system, according to some embodiments.
Figure 15:
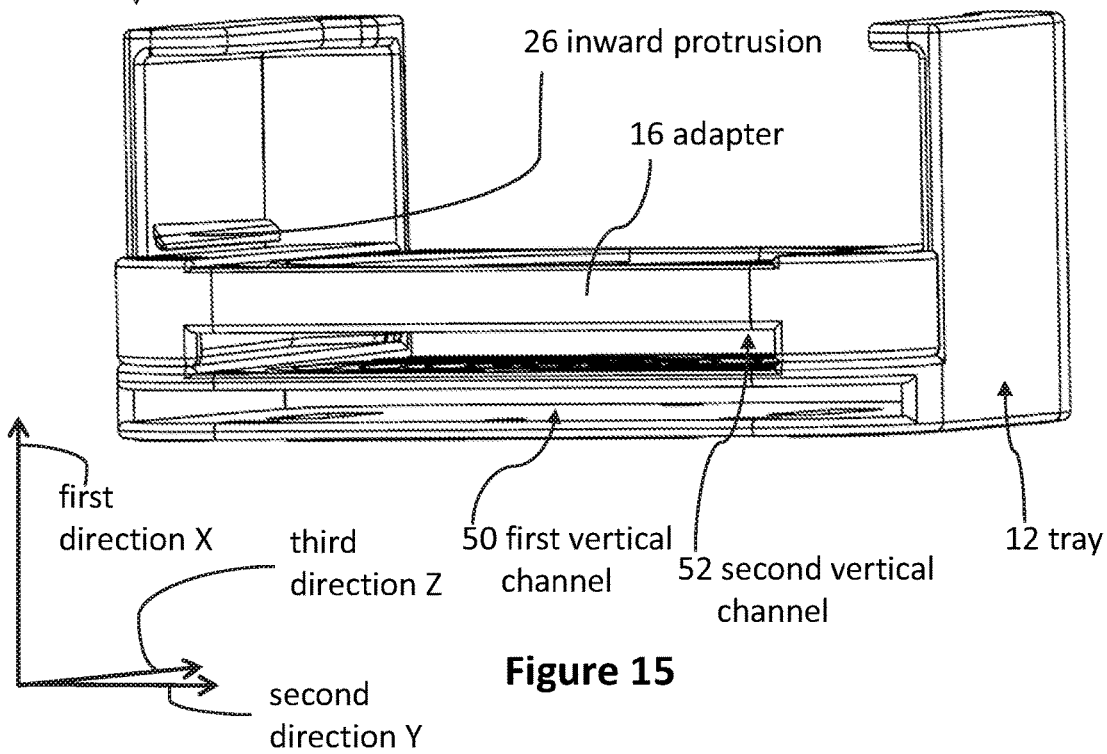
FIG. 15 illustrates a second top perspective view of an embodiment of the mounting system, according to some embodiments.

As further shown in FIGS. 14 and 15, the first inward protrusion 26a and the second inward protrusion 26b can securely retain the adapter 16 along the first direction X. Described differently, the first and second inward protrusions 26a, 26b can substantially fix the adapter 16 with respect to the first direction X.

As illustrated in FIG. 10, in some embodiments, the adapter 16 comprises a large ventilation channel 18 that extends through the adapter 16 along the first direction X. In this manner, the large ventilation channel 18 can provide air flow to a surface of the electronic device 11 to thereby regulate or maintain a temperature of the electronic device 11. The large ventilation channel 18 can be elongate along the second direction Y and the third direction Z. As well, the large ventilation channel 18 can define any shape, such as round, rectangular, and the like. In some embodiments, the adapter 16 can comprise at least one small ventilation channel 20 that extends through the adapter 16 along the first direction X. In some embodiments, the large ventilation channel 18 is at least partially surrounded by the at least one small ventilation channel 20. As such, a center point or location of the base 14 can be located within the large ventilation channel 18.

Alternatively, in some embodiments, the large ventilation channel 18 and the small ventilation channel 20 can be located in opposite positions with respect to one another, as previously described. For example, the at least one small ventilation channel 20 can be at least partially surrounded by the large ventilation channel 18. As well, a center location of the base 14 can be located within the small ventilation channel 20.

The adapter 16 can be configured to fit in a variety of ways within the mounting system 10. In some embodiments, when the electronic device 11 is coupled to the mounting system 10 a portion of the adapter 16 can be located between the television 13 and the electronic device 11. As well, in some embodiments, when the electronic device 11 is coupled to the mounting system 10, the electronic device 11 can be located between the base 14 and a portion of the adapter 16.

As shown in FIGS. 10-13, the tray 12 can comprise an outward facing periphery 30 and an inward facing periphery 31 that is opposite the outward facing periphery 30. When the electronic device 11 is coupled to the mounting system 10, the outward facing periphery 30 can comprise an outer surface that faces away from the electronic device 11. Accordingly, the inward facing periphery 32 can define an inner surface that faces towards the electronic device 11. When the adapter 16 is coupled to the tray 12, portions of the adapter 16 can be arranged and configured to align with portions of the outward facing periphery 30 and the inward facing periphery 32. For example, as shown in FIG. 13, when the adapter 16 is received by the tray 12, a top portion of the outer periphery 32 of the adapter 16 can be substantially aligned (along the first direction X) with a top portion of the outward facing periphery 30 of the tray 12. Likewise, when the adapter 16 is received by the tray 12, a bottom portion of the outer periphery 32 of the adapter 16 can be substantially aligned (along the first direction X) with a bottom portion of the outward facing periphery 30 of the tray 12. As such, when the adapter 16 is decoupled from the tray 12, the outward facing periphery 30 of the tray 12 can define a first footprint of the mounting system 10. Accordingly, when the adapter 16 is coupled to the tray 12, the mounting system 10 can define a second footprint. In some embodiments, the first footprint is substantially aligned (along the first direction X) with the second footprint. However, in some embodiments, the first footprint is not substantially aligned (along the first direction X) with the second footprint.

In the embodiment illustrated in FIG. 4, the anchor wall 533 is rigidly coupled to the base 14 by connecting protrusions 27. As shown in FIG. 10, the mounting system 10 comprises an adapter 16 slideably received by the base 14 between the first sidewall 22 and the second sidewall 24. (FIG. 10 illustrates an exploded view with the adapter 16 slid out of the base 14. The adapter 16 comprises an aperture 18 configured to be in fluid communication with the first ventilation channel 50 and the second ventilation channel 54. FIGS. 14 and 15 illustrate the adapter 16 slid into mounting system 10 such that the aperture 18 is in fluid communication with the first ventilation channel 50 and the second ventilation channel 54.

With continued reference to FIGS. 10-13, the inner periphery 31 of the adapter 16 can be arranged and configured to fit within the inward facing periphery 31 of the tray 12. As such, the adapter 16 can be slideably received by the tray 12. In some embodiments, the inner periphery 31 is dimensionally sized such that the adapter 16 easily slides into the tray 12. "Easily" can be defined as requiring minimal force or effort by a human hand, almost effortless. However, in some embodiments, the inner periphery 31 is dimensionally sized such that the adapter 16 frictionally slides into the tray 12. This arrangement can be used in various embodiments where the mounting system 10 is oriented such that a friction fit between the adapter 16 and tray 12 is required in order to retain the adapter 16 within the tray 12. Alternatively, this configuration can be used in embodiments where the mating direction to couple the adapter 16 to the tray 12 is along another direction, such as the first direction X.

Figure 16:
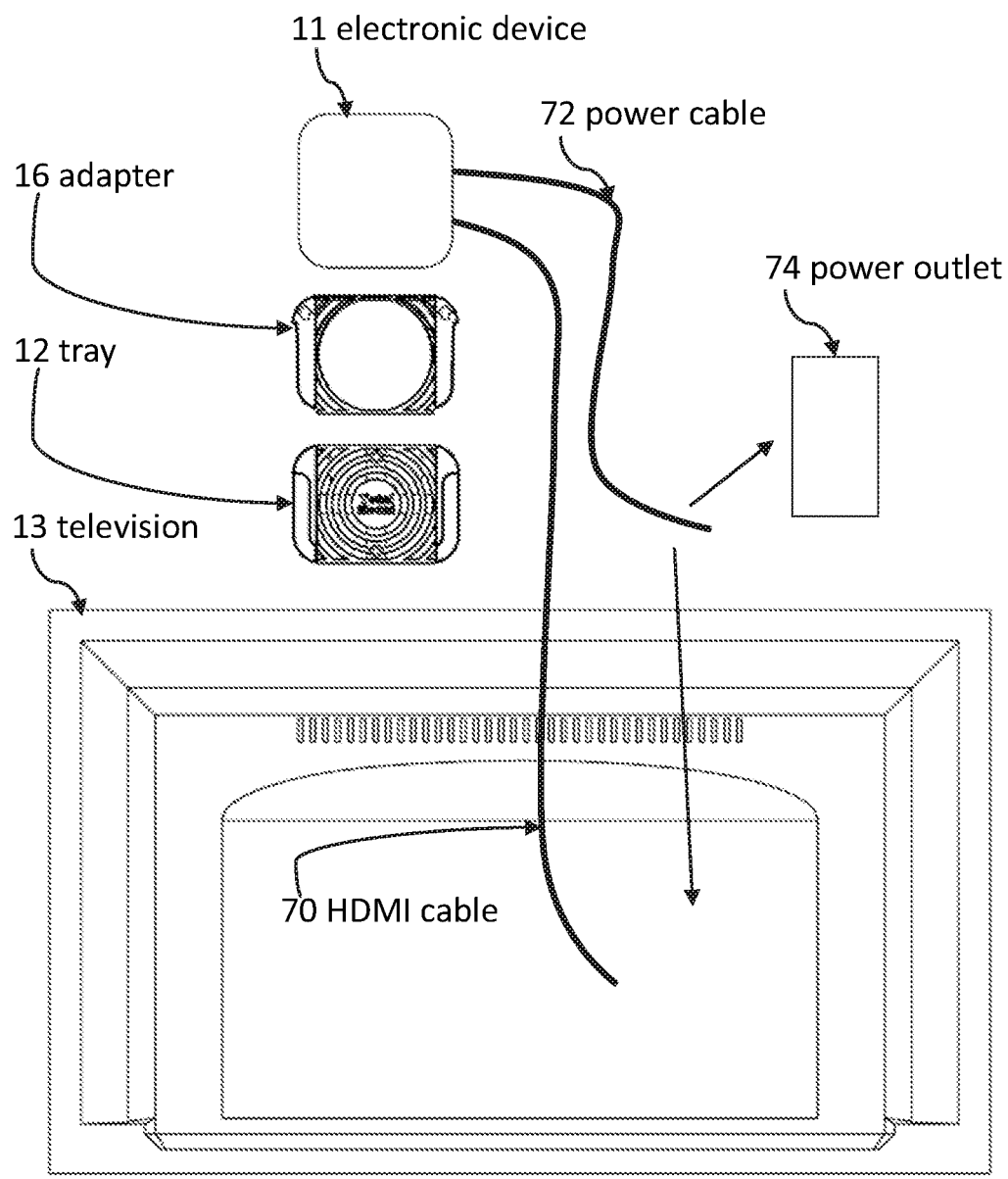
FIG. 16 illustrates a front view of an embodiment of the system, according to some embodiments.

As shown in FIG. 16, embodiments of the mounting system 10 can even include an electronic device 11, such as a streaming media player 11. As well, the mounting system 10 can include a television 13 communicatively coupled to the streaming media player 11. The mounting system 10 can even include a HDMI cable 70 having a first end coupled to the streaming media player 11 and a second end coupled to the television 13. The HDMI cable 70 can be configured to transmit digital signals between the streaming media player 11 and the television 13. Even still, the mounting system 10 can include a power cable 72 having a first end coupled to the streaming media player 11 and a second end coupled to one of the television 13 and a wall outlet 74. The power cable 72 can be configured to transmit electricity from one of the television 13 and the wall outlet 74 to the streaming media player 11.

Figure 17A:
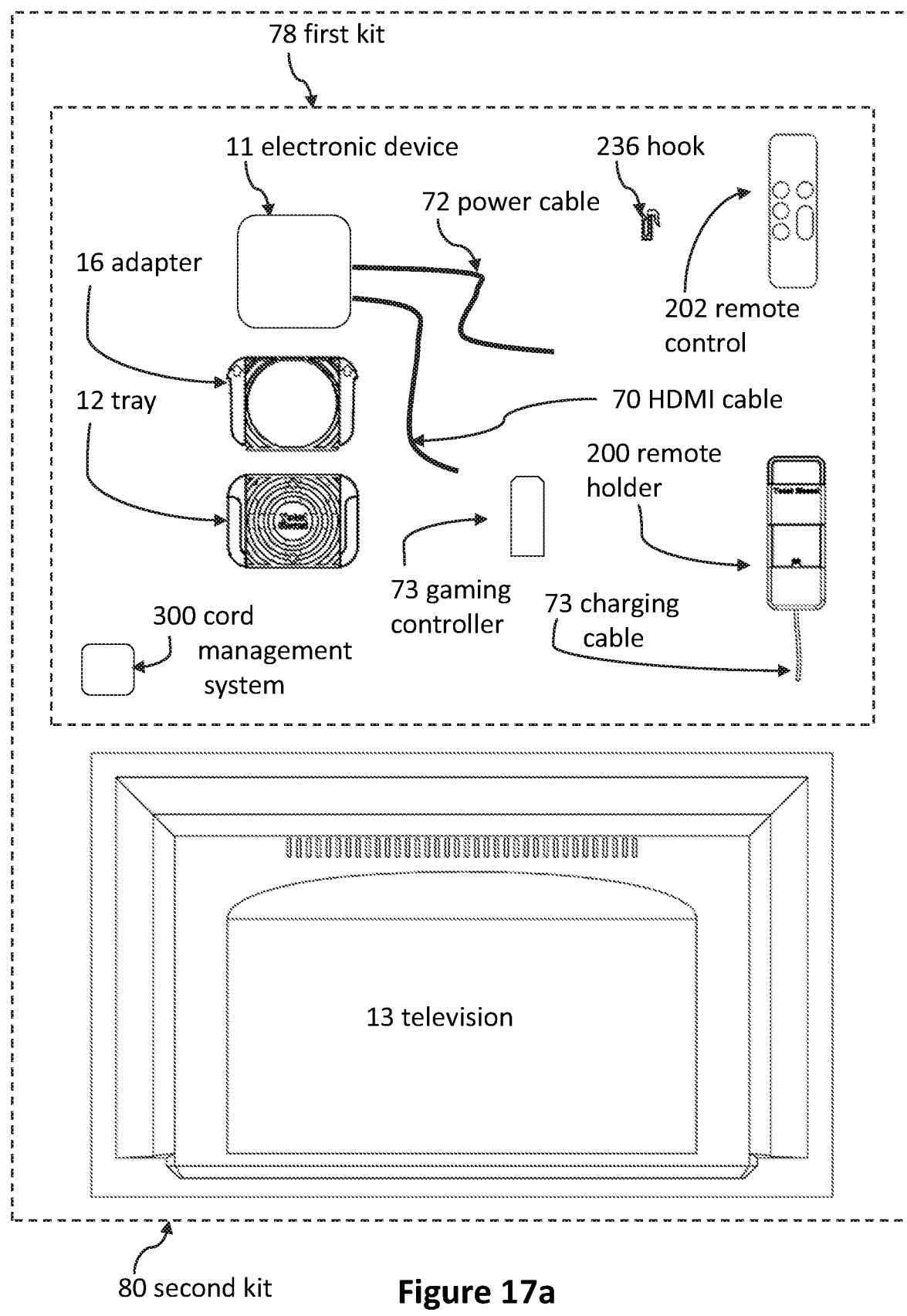
FIG. 17*a* illustrates a first kit embodiment and a second kit embodiment, according to various embodiments.

With reference to FIG. 17*a*, the disclosure includes various kits. For example, a first kit 78 can include the electronic device 11 (such as a streaming media player and/or gaming console), a tray 12 configurable to couple the electronic device 11 to the television 13, and an adapter 16 that can be slideably received by the tray 12. It should be appreciated that the tray 12 can also be referred to as a mount 12.

The first kit can also include an HDMI cable 70 that can be communicatively coupled with the electronic device 11 and a television 13, a power cable 72 that can be electrically coupled to the electronic device 11 to thereby supply power, a remote holder 200 (such as the remote holders disclosed in U.S. Provisional Patent Applications 62/242,988 and 62/243,722), and a remote control 202 that can be communicatively coupled to the electronic device 11 and/or television 13. The first kit 78 can even include a remote control charging cable 73 that can be electrically coupled to the remote control 202, a hook 236 that can securely couple the tray 12 to the television 13, a gaming controller 85 configurable to be communicatively coupled to the electronic device 11 (e.g. gaming console), and a cord management system 300 configurable to guide at least one of the charging cable, the High-Definition Multimedia Interface cable, and the power cable (such as the cord management systems disclosed in U.S. Provisional Patent Application 62/245,723). In some embodiments, a second kit 80 includes the components of the first kit and further includes a television 13.

It should be appreciated that the disclosure also includes kits that comprise any combination of components from the first and second kits 78, 80. For example, with reference to FIG. 17*b*, the disclosure includes a third kit 82 that comprises a tray 12, a remote holder 200, and a cord management system 300. As shown in FIG. 17*c*, a fourth kit 84 can include a tray 12, adapter 16, remote holder 200, and cord management system 300. As well, some kits comprise various quantities of specific components. For example, in some embodiments a kit comprises one tray 12, one remote holder 200, and two cord management systems 300.

Figure 17B:
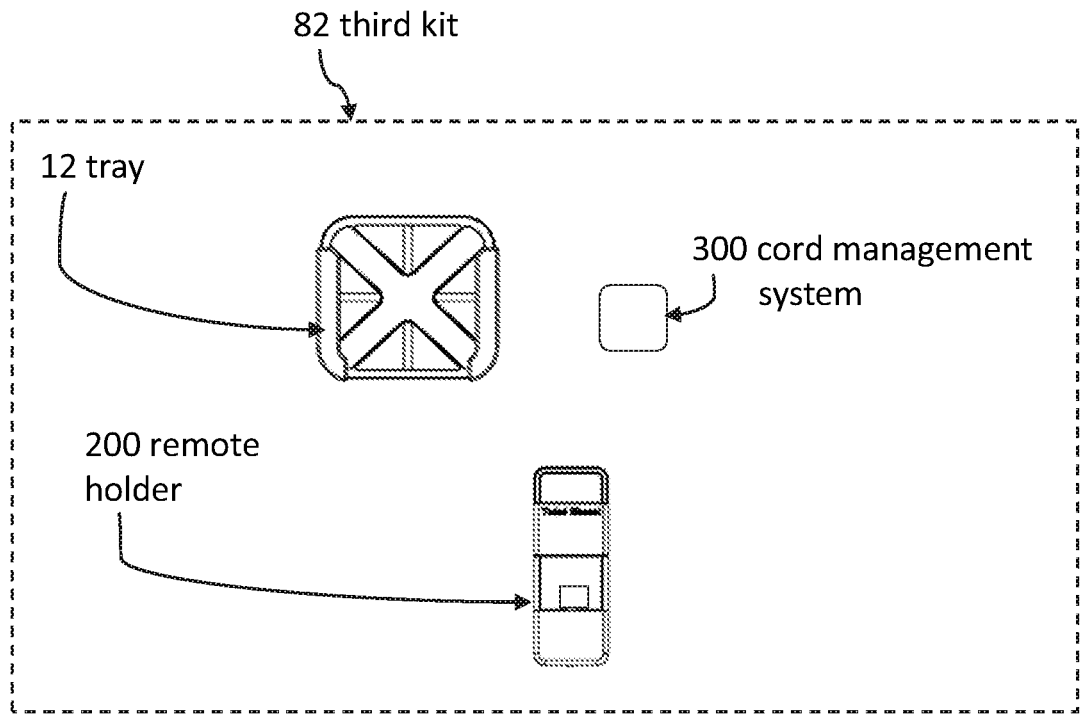
FIG. 17*b* illustrates a third kit embodiment, according to various embodiments.
Figure 17C:
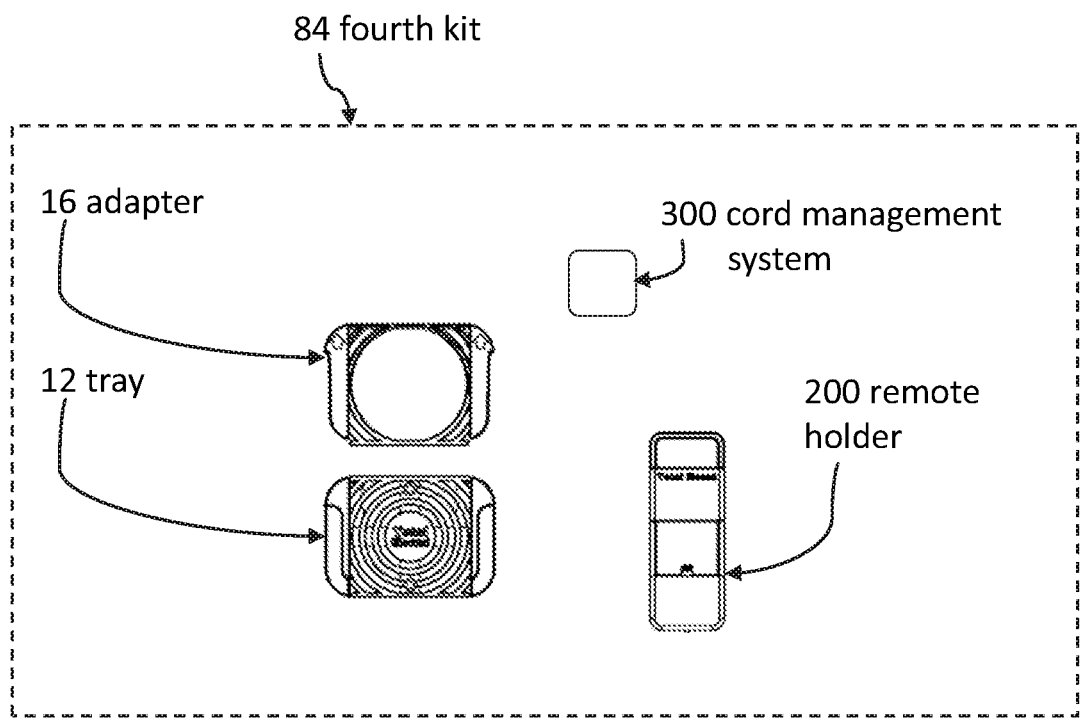
FIG. 17*c* illustrates a fourth kit embodiment, according to various embodiments.

The disclosure also includes other kits, not shown in FIGS. 17*a*-17*c*. For example, the disclosure includes a fifth kit comprising the electronic device 11, tray 12, adapter 16, and HDMI cable 70. The disclosure also includes a sixth kit comprising the tray 12, adapter 16, and HDMI cable 70. Even still, the disclosure includes a seventh kit comprising the electronic device 11, tray 12, and adapter 16. Furthermore, the disclosure includes an eighth kit comprising the tray 12, adapter 16, HDMI cable 70 and/or the power cable 72. As previously mentioned, it should be appreciated that the disclosure includes any combination of components as illustrated in FIG. 17*a*.

In some embodiments, the electronic device 11 is a first electronic device 11*a* having a first thickness. In this regard, the adapter 16 can be slideably received by the mount 12 whereby the adapter 16 allows the mount 12 to securely receive a second electronic device 11*b* having second thickness that is less than the first thickness.

In some embodiments, the tray 12 comprises adhesive 38 configurable to couple the electronic device 11 to a backside of the television 13. As well, the remote holder 200 can include adhesive configurable to couple the electronic device 11 to at least one of a side of the television 13 and the backside of the television. As it should be appreciated, the cord management system 300 can also comprise adhesive configurable to couple the cord management system 300 to the television 13, such as the backside of the television.

The tray 12 and remote holder 200 can be configured to receive various cables. In some embodiments, the tray 12 is configurable to receive at least one of a power cable 72 electrically coupled to the electronic device 11 and an HDMI cable 70 communicatively coupled to the electronic device 11. As well, the remote holder 200 can be configurable to receive a charging cable 73 such that when the remote holder 200 receives the remote control 202 the charging cable 73 electrically couples with the remote control 202.

Figure 20:
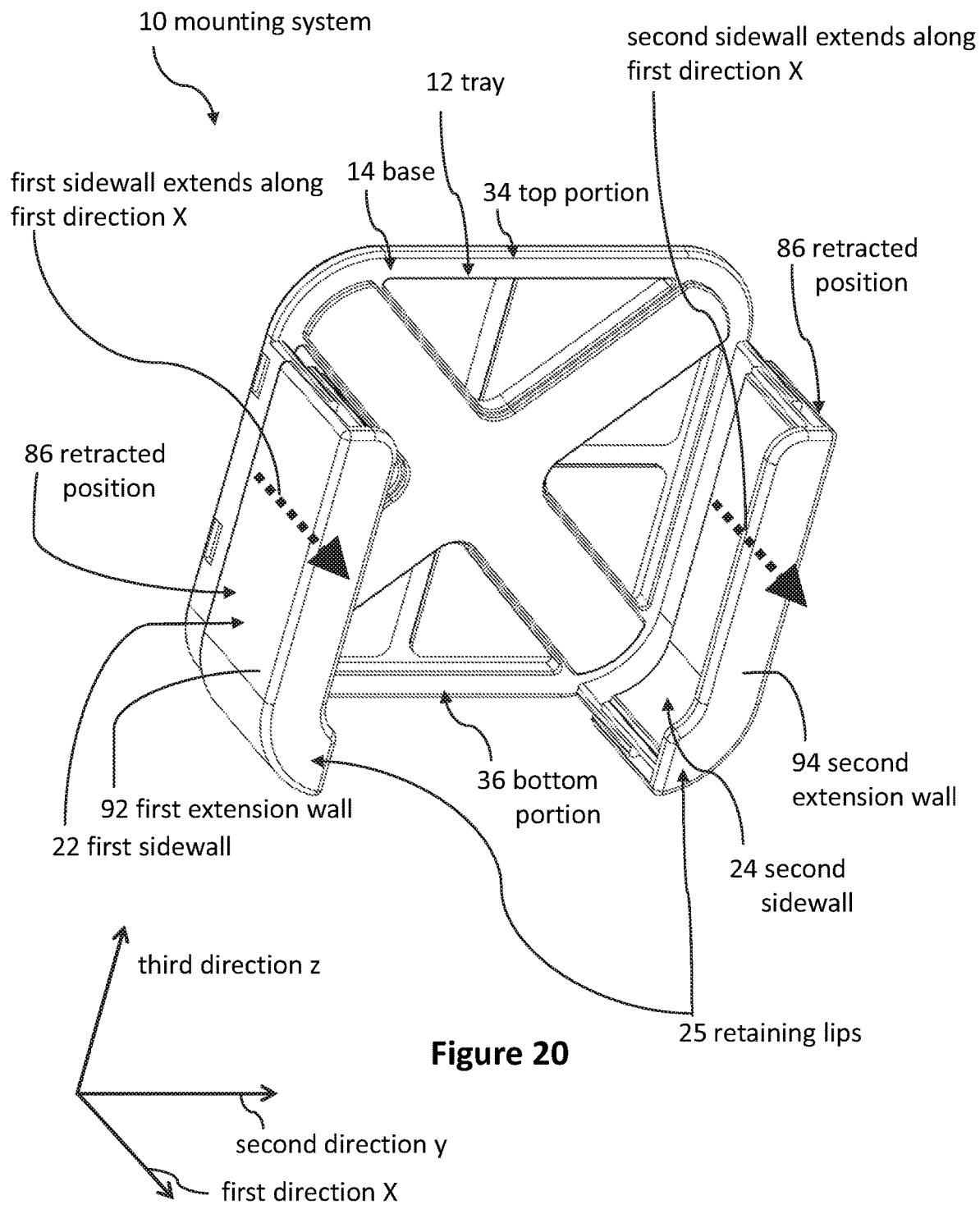
FIG. 20 illustrates a first front perspective view of an embodiment of a mounting system, according to some embodiments.

Embodiments of the mounting system 10 can be configured to receive different size electronic devices 11. With specific reference to FIGS. 20-30, mounting systems 10 can include height adjustable sidewalls that can be configured to receive electronic devices 11 of varying thicknesses or heights. In some embodiments, the mounting system 10 can include a base 14 configured to hold the electronic device 11 such that a portion of the base 14 is located between the television 13 and the electronic device 11. The base 14 can comprise a first sidewall 22 and a second sidewall 24. As shown in FIG. 20, mounting systems can also include retaining lips 25 coupled to the first sidewall 22 and the second sidewall 24. The retaining lips 25 can be configured to impede the electronic device 11 from falling out of the base 14.

In some embodiments, a mounting system 10 can be configurable to couple an electronic device 11 to a television 13. As shown in FIGS. 20-30, the mounting system 10 can include a base 14 configured to hold the electronic device 11. In some embodiments, the mounting system 10 also includes a first sidewall 22 that extends from the base 14 along a first direction X that points away from the television 13 and a second sidewall 24 that extends from the base 14 along the first direction X, wherein the second sidewall 24 is spaced from the first sidewall 22 along a second direction Y that is perpendicular to the first direction X.

Figure 33:
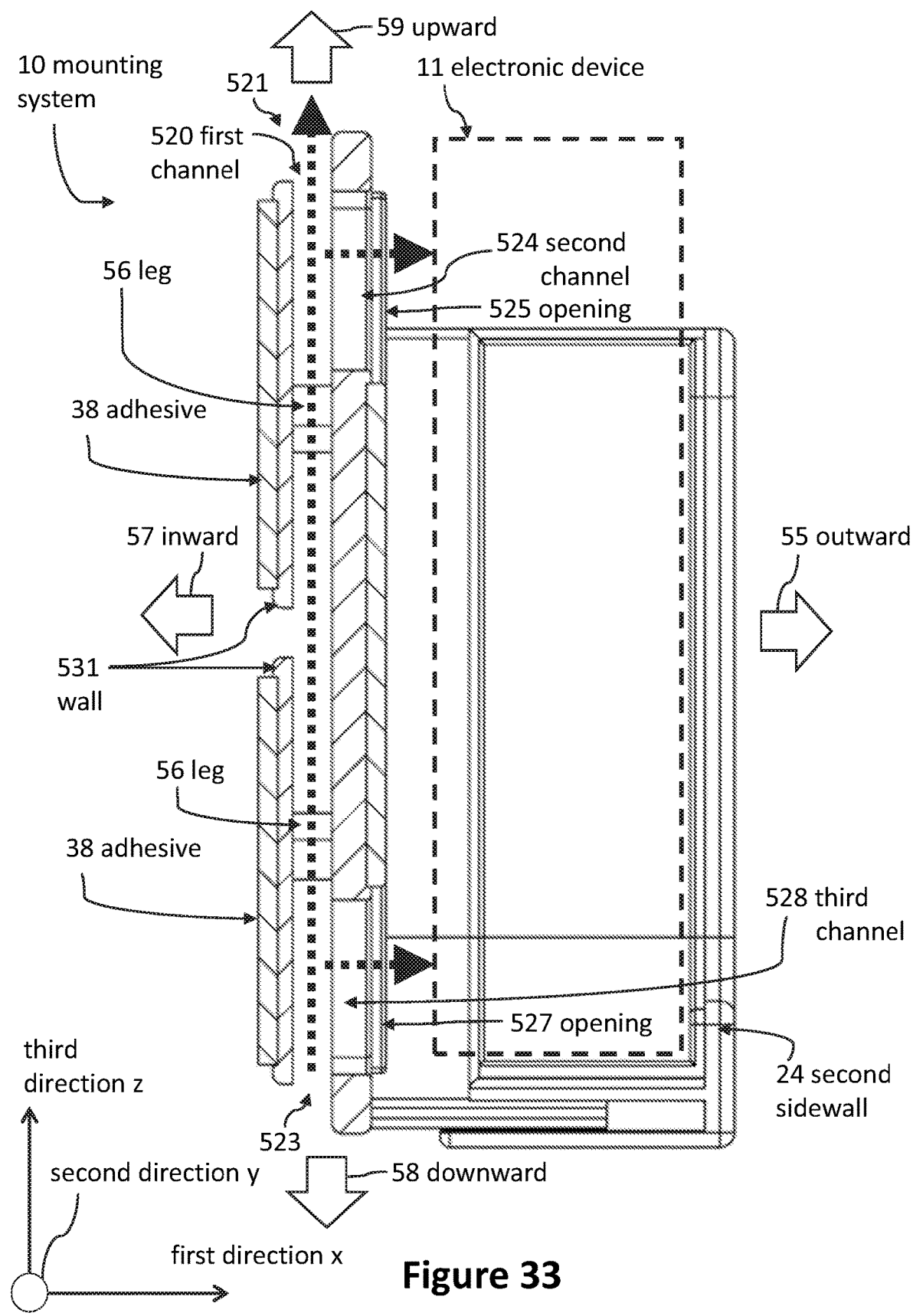
FIG. 33 illustrates a cross-sectional view along line C-C from FIG. 32, according to some embodiments.

FIG. 33 illustrates outward direction 55 and inward direction 57 (as indicated by the arrows in FIG. 33). The outward direction 55 is away from the adhesive 38 towards a portion of the mounting system 10 configured to hold an electronic device 11. The inward direction 57 is away from the adhesive 38 and is opposite relative to the outward direction 55. The outward direction 55 is away from a surface to which the mounting system 10 is coupled (e.g., via the adhesive 38). The inward direction 57 is towards the surface to which the mounting system 10 is coupled. In the context of FIG. 3, the inward direction 57 is towards the television 13 and the outward direction 55 is away from the television 13.

FIG. 33 illustrates a downward direction 58, which is perpendicular to the outward direction 55. FIG. 33 also illustrates an upward direction 59, which is perpendicular to the outward direction 55. As shown in FIG. 33, the first channel 520 extends from a first opening 521 (that faces upward) to second opening 523 (that faces downward). The vertical dashed arrow in FIG. 33 indicates the first ventilation channel 520. The horizontal (outward) dashed arrows in FIG. 33 indicate ventilation channels 524, 528 that face outward, are in fluid communication with the first ventilation channel 520, and are in fluid communication with a portion of the mounting system 10 that holds the electronic device 11.

As shown in FIG. 33, the mounting system 10 comprises an outward direction 55, a first opening (e.g. 525 or 527) and a second opening (e.g., 521 or 523). The first opening (e.g.

525 or 527) faces outward, the second opening (e.g., 521 or 523) faces perpendicular to the outward direction 55, and the first ventilation channel 520 and the second ventilation channel (e.g., 524 or 528) fluidly couple the first opening (e.g. 525 or 527) to the second opening (e.g., 521 or 523) such that the mounting system 10 is configured to enable air heated by the electronic device 11 to enter the first opening (e.g. 525 or 527) in an inward direction 57, pass through the second ventilation channel (e.g., 524 or 528), pass through the first ventilation channel 520, and then exit the second opening (e.g., 521 or 523).

Figure 31:
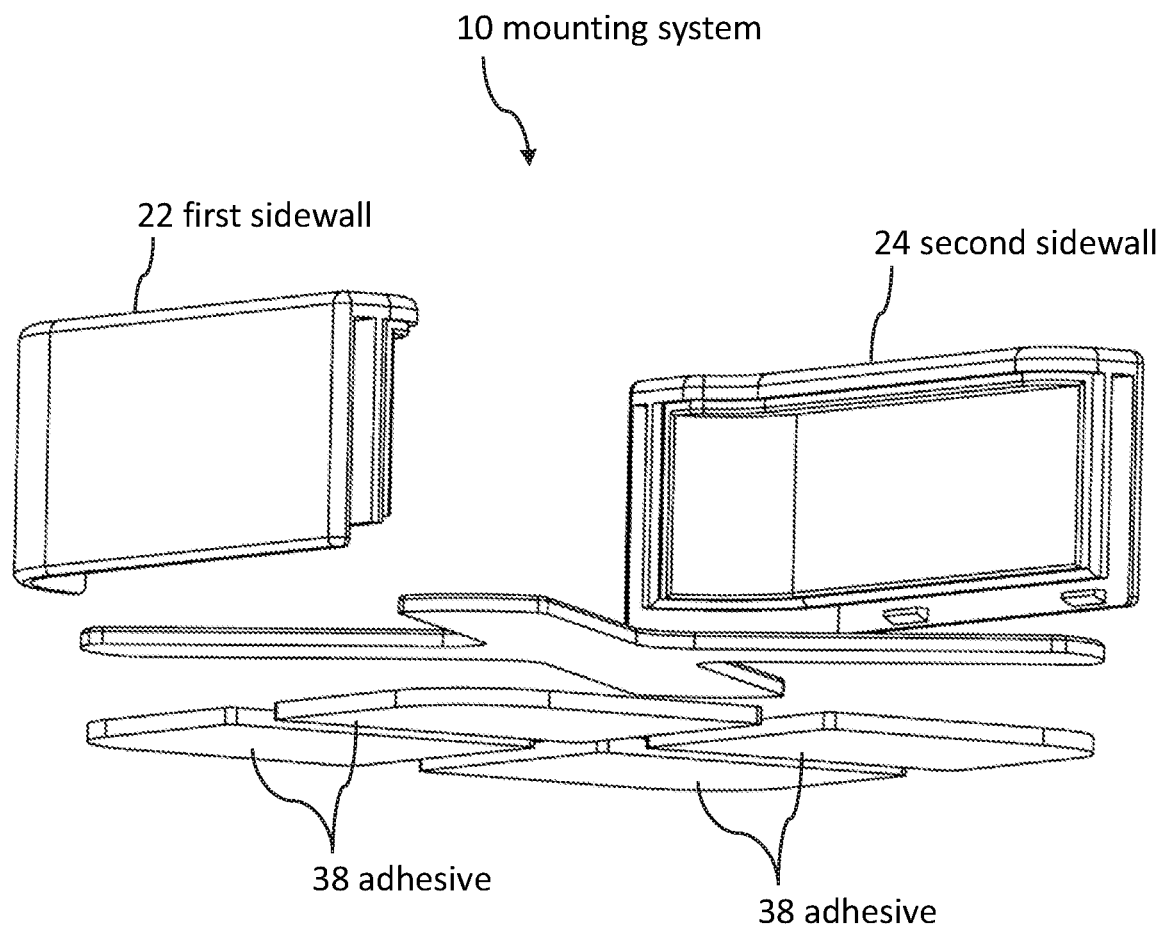
FIG. 31 illustrates an exploded bottom perspective view of a mounting system, according to some embodiments.
Figure 32:
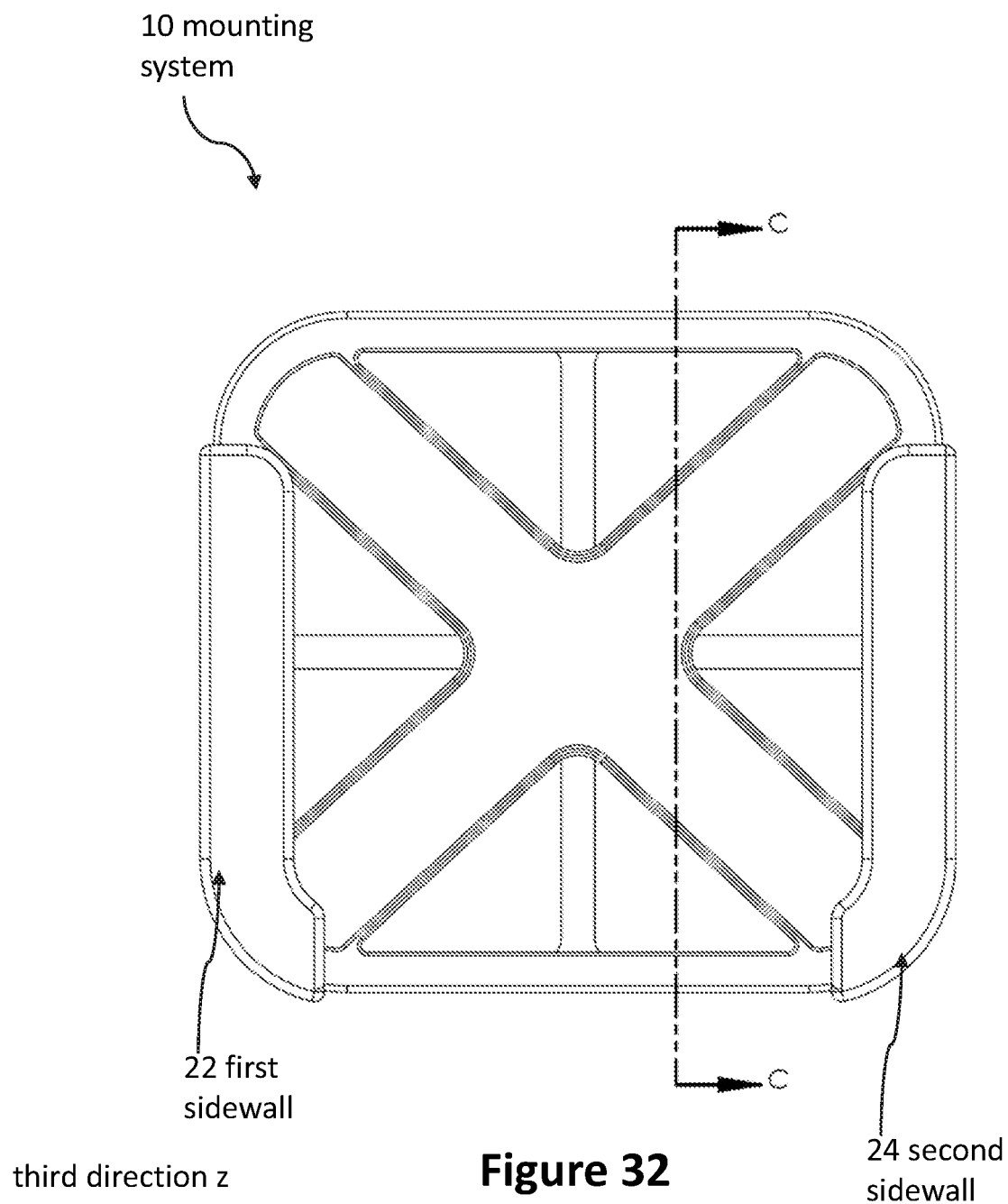
FIG. 32 illustrates a front view of an embodiment of a mounting system, according to some embodiments.

Various elements are hidden in the perspective view shown in FIG. 31. For example, the base is hidden. The interior of the side walls can be overmolded with a material (e.g., a thermoplastic elastomer) that is softer than the material (e.g., ABS) that is used to mold other elements. Protrusions (that enable the sidewalls to lock in upwards or downward positions) can face towards an area configured to hold the electronic device between the sidewalls or away from this area.

Figure 21:
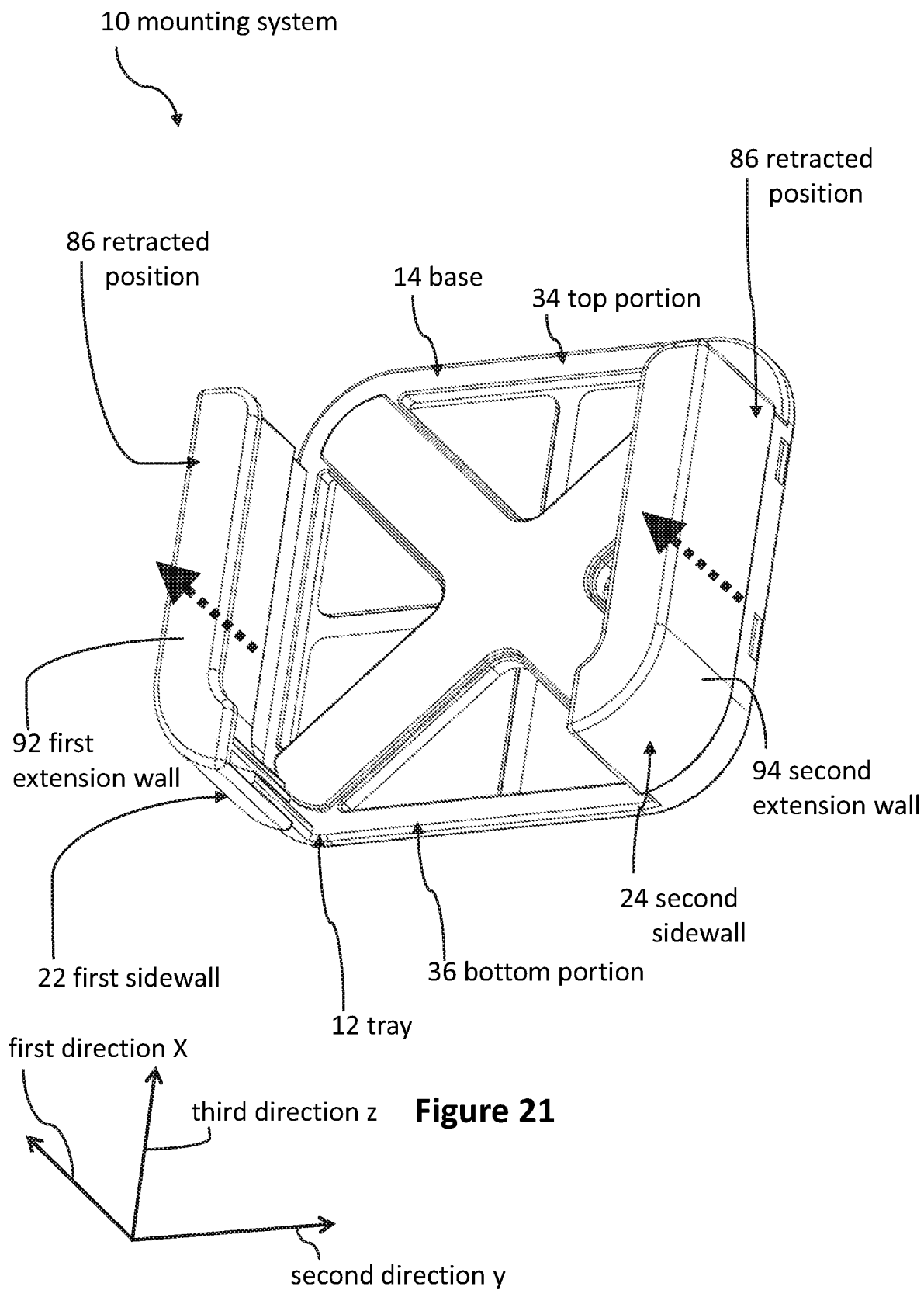
FIG. 21 illustrates a second front perspective view of an embodiment of a mounting system, according to some embodiments.

Now with reference to FIGS. 20-22, 25, and 27-32, embodiments of the mounting system 10 also include a first extension wall 92 slideably coupled to the first sidewall 22 and a second extension wall 94 slideably coupled to the second sidewall 24. In some embodiments, the first extension wall 92 moves with respect to the first sidewall 22 along the first direction X. As well, in some embodiments, the second extension wall 94 moves with respect to the second sidewall 24 along the first direction X. In this manner, the first and second extension walls 92, 94 can move between a retracted position 86 (or an inward locked position 86), as shown in FIGS. 20 and 21, and an extended position 88 (or an outward locked position 88), as shown in FIG. 22, to thereby accommodate different size (e.g. thickness or height) electronic devices 11. In some embodiments, the first extension wall 92 moves with respect to the first sidewall 22 along both the first direction X and the second direction Y. As well, in some embodiments, the second extension wall 94 moves with respect to the second sidewall 24 along both the first direction X and the second direction Y.

When both the first extension wall 92 and the second extension wall 94 are in the extended position 88, a first electronic device 11a having a first thickness can be securely coupled to the mounting system 10. It should be appreciated that thickness (e.g. first thickness and second thickness) can define the height of the electronic device along the first direction X. As well, when both the first extension wall 92 and the second extension wall 94 are in the retracted position 86, a second electronic device 11b having a second thickness can be securely coupled to the mounting system 10. In some embodiments, the first thickness is greater than the second thickness. In other words, when the first and second extension walls 92, 94 are in the extended position 88, thicker electronic devices 11 can be securely coupled between the first and second extension walls 92, 94. As such, when the first and second extension walls 92, 94 are in the retracted position 86, thinner electronic devices 11 can be securely coupled between the first and second extension walls 92, 94. In some embodiments, the first thickness is about 1.4 inches. In some embodiments, the second thickness is about 0.9 inches.

It should be appreciated that "securely coupled" means snugly fit or closely fit. In other words, "securely coupled" can mean that the inside space between the base and a top underside of the extension wall is slightly greater than the thickness (e.g. height) of the electronic device 11. For example, if the thickness of a first electronic device is 1.4 inches, then in the extended position 86 the inside space of the first and second extension walls 92, 94 can be a distance slightly greater than 1.4 inches, e.g. 1.45 inches, 1.5 inches, or even 1.6 inches. In another example, if the thickness of a second electronic device 11b is about 0.9 inches, then in the retracted position 86 the inside space of the first and second extension walls 92, 94 can be slightly greater than 0.9 inches, e.g. 0.95 inches, 1.0 inches, or even 1.1 inches.

FIG. 22 illustrates anchor walls 533 oriented parallel to the base 14 (and within plus or minus 30 degrees of parallel to the base) and coupled to the base 14 (labeled in FIG. 4) by at least one connecting protrusion 56 (shown in FIG. 33) that protrudes inward from the base 14 to the anchor wall 533.

In some embodiments, the connecting protrusion 56 comprises a flexible neck (e.g., flexible neck 42, 52, 92, 124, 154, 158 as shown in FIG. 4 of U.S. patent application Ser. No. 14/572,293; filed Dec. 16, 2014; and entitled MOUNTING SYSTEMS FOR ELECTRONIC DEVICES). The entire contents of U.S. patent application Ser. No. 14/572,293 are incorporated by reference herein. The flexible neck can enable the anchor wall 533 to be a foot 174, 176, 200, 206, 202, 204 configured to enable the adhesive to pivot and move relative to the base as explained in U.S. patent application Ser. No. 14/572,293 (e.g., as shown in FIG. 4).

Referring now to FIG. 22, an adhesive 38 is coupled to the anchor wall 533 and is configured to couple the mounting system 10 to a wall, such as the wall of a television 13 (shown in FIG. 3). The adhesive 38 can pivot and move relative to the base 14 due to flexible necks.

As used herein, an "anchor wall" is a wall having adhesive that is used to couple the mounting system to a mounting surface. The anchor wall 533 can be molded plastic. Adhesive 38 can be bonded to the anchor wall 533.

As shown in FIGS. 20, 21, and 23-26, a bottom portion of the first sidewall 22 and a bottom portion of the second sidewall 24 can curve inward such that the bottom portion of the first sidewall 22 can face the bottom portion of the second sidewall 24. As well, the first extension wall 92 can include a first retaining lip 25 that extends from a top portion to a bottom portion of the first extension wall 92. Accordingly, the second extension wall 94 can include a second retaining lip 25 that extends from a top portion to a bottom portion of the second extension wall 94. The first and second retaining lips 25 can thereby be configured to fix the electronic device 11 to the base 14 along the first direction X.

In some embodiments, the first extension wall 92 comprises a first retention portion 25 that faces away from the first sidewall 22 and the second extension wall 94 comprises a second retention 25 portion that faces away from the second sidewall 24. When the first extension wall 92 is in the extended position 88, the first retention portion 25 can be located a first distance from the base 14. Accordingly, when the first extension wall 92 is in the retracted position 86, the first retention portion 25 can be located a second distance from the base 14. Likewise, when the second extension wall 94 is in the extended position 88, the second retention portion 25 can be located a third distance from the base 14. As well, when the second extension wall 94 is in the retracted position 86, the second retention portion 25 can be located a fourth distance from the base 14. In some embodiments, the first distance is greater than the second distance and the third distance is greater than the fourth distance. Generally speaking, the movement of the first and second extension walls 92, 94, and therefore the first and second retention portions 25, along the first direction X, can thereby allow the mounting system 10 to securely couple to electronic devices 11 of various thicknesses (e.g. heights).

When the first and second extension walls 92, 94 are positioned in the retracted position 86 and/or the extended position 88, the extension walls 92, 94 can thereby be locked into place. In other words, when the first extension wall 92 is in the retracted position 86 and/or extended position 88, the first extension wall 92 can be locked in place relative to the first sidewall 22 and/or the base 14. As well, when the second extension wall 94 is in the retracted position 86 and/or extended position 88, the second extension wall 94 can be locked in place relative to the second sidewall 24 and/or the base 14.

Accordingly, with reference to FIGS. 27-30, some embodiments of the mounting system 10 can further include a first engaging portion 106 located along a portion of the first extension wall 92 and a second engaging portion 112 located along a portion of the second extension wall 94. As well, embodiments of the mounting system 10 can include a first retraction slot 102 located along an outer surface of the first sidewall 22. The first retraction slot 102 can be configured to receive the first engaging portion 106 when the first extension wall 92 is in the retracted position 86. Likewise, some embodiments of the mounting system 10 can include a second retraction slot 108 located along an outer surface of the second sidewall 24. The second retraction slot 108 can be configured to receive the second engaging portion 112 when the second extension wall 94 is in the retracted position 86.

Figure 28:
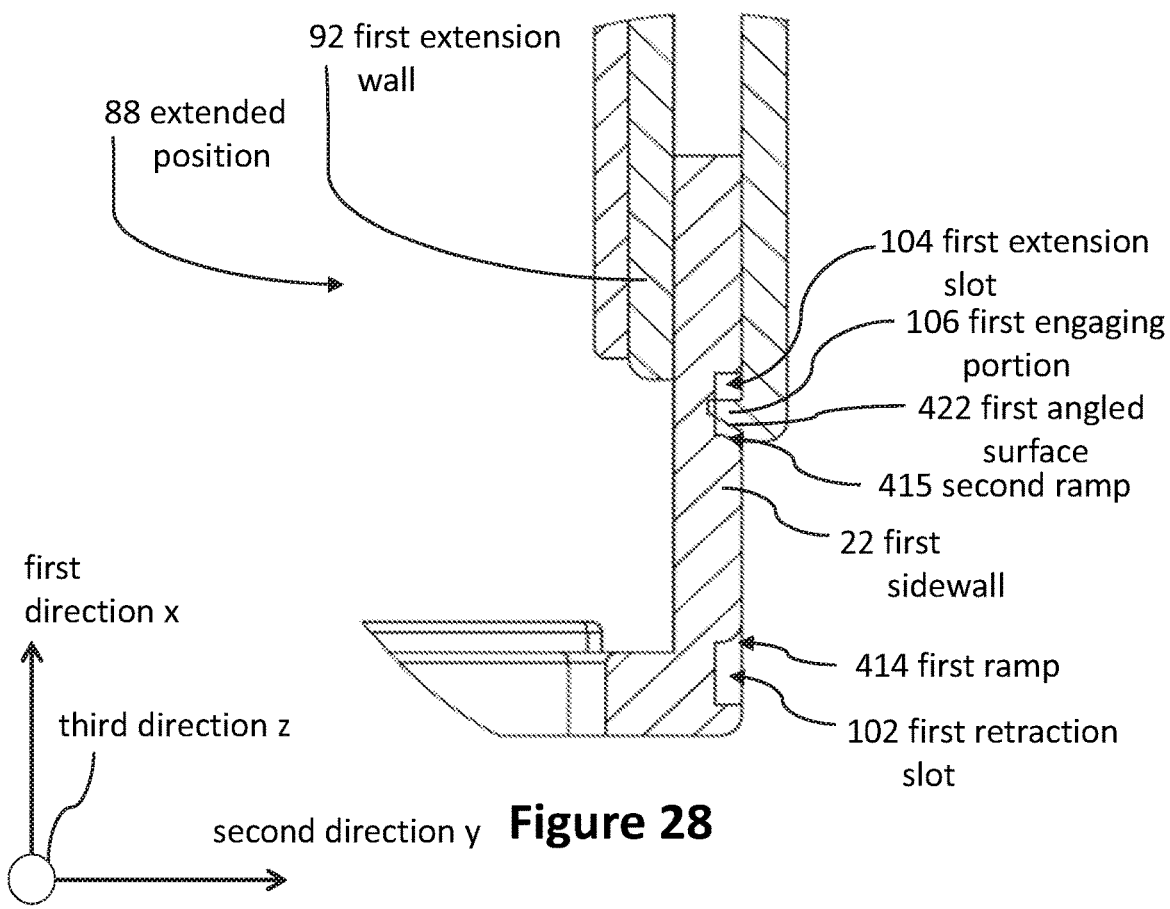
FIG. 28 illustrates detailed view E from FIG. 27, according to some embodiments.
Figure 29:
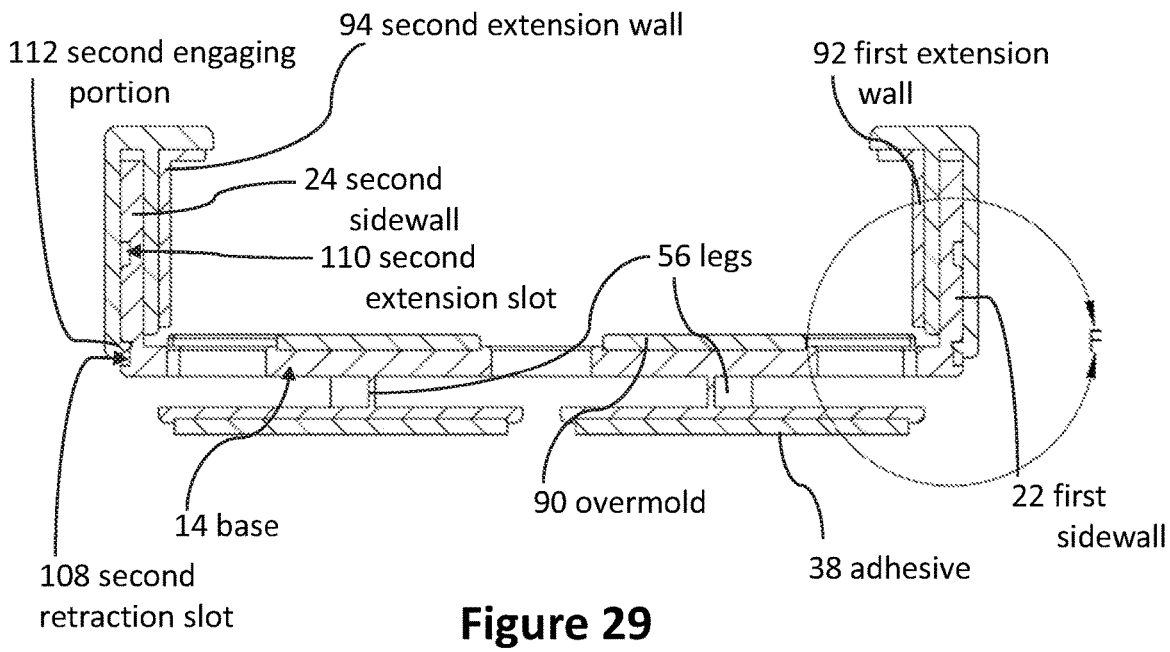
FIG. 29 illustrates a cross-sectional view along line D-D from FIG. 25 with first and second extension walls in a retracted position, according to some embodiments.
Figure 30:
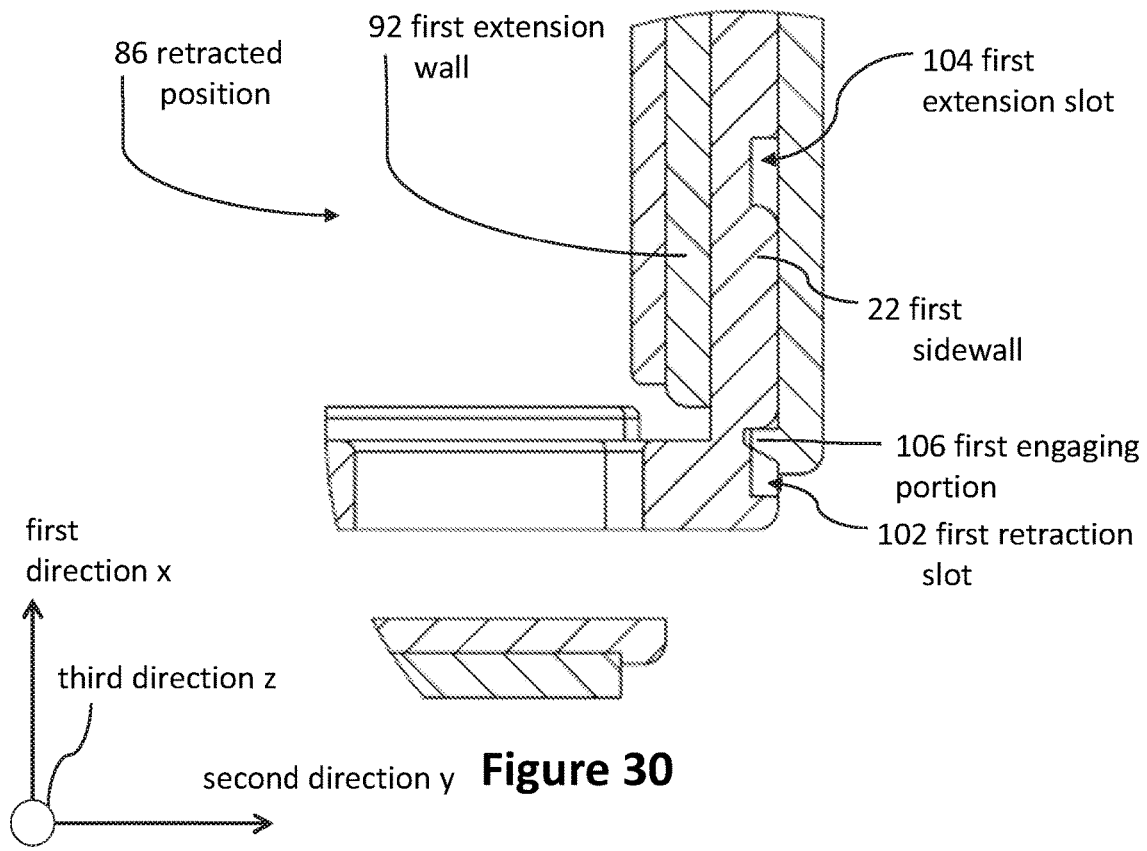
FIG. 30 illustrates detailed view E from FIG. 29, according to some embodiments.

The slots (e.g., 102, 104) can be indentation in a first sidewall (e.g., as shown in FIG. 28). The first sidewall can be coupled to a second sidewall configured to move inward and outward relative to the first sidewall. The second sidewall can include a protrusion oriented towards the indentations to releasably snap into an indentation. The system can include one indentation located outward from a second indentation. These two indentations can form a first locking mechanism. The system can include a second identical locking mechanism. The first locking mechanism can be located on an upper portion of the sidewall system and the second locking mechanism can be located on a lower portion of the sidewall system.

Accordingly, when the first extension wall 92 is located in the retracted position 86, the first engaging portion 106 can lock with the first retraction slot 102 to thereby lock the first extension wall 92 with respect to the first sidewall 22 and/or the base 14. As well, when the second extension wall 94 is located in the retracted position 86, the second engaging portion 112 can lock with the second retraction slot 108 to thereby lock the second extension wall 94 with respect to the second sidewall 24 and/or the base 14.

Mounting systems 10 can also include a first extension slot 104 located along the outer surface of the first sidewall 22. The first extension slot 104 can be located further from the base 14 than the first retraction slot 102. In operation, the first extension slot 104 can be configured to receive the first engaging portion 106 when the first extension wall 92 is in the extended position 88. As well, some embodiments of the mounting systems 10 can also include a second extension slot 110 located along the outer surface of the second sidewall 24. The second extension slot 110 can be located further from the base 14 than the second retraction slot 108. The second extension slot 110 can be configured to receive the second engaging portion 112 when the second extension wall 94 is in the extended position 88.

When the first extension wall 92 is located in the extended position 88, the first engaging portion 106 can lock with the first extension slot 104 to thereby lock the first extension wall 92 with respect to the first sidewall 22 and/or the base 14. As well, when the second extension wall 94 is located in the extended position 88, the second engaging portion 112 can lock with the second extension slot 110 to thereby lock the second extension wall 94 with respect to the second sidewall 24 and/or the base 14.

With reference to FIGS. 23, 24, and 27-30, embodiments of the mounting system 10 can include additional slots and engaging portions to provide additional security and support between the extension walls and sidewalls. While not explicitly shown, mounting systems 10 can include a third engaging portion 118 located along the portion of the first extension wall 92. The third engaging portion 118 can be spaced from the first engaging portion 106 along the third direction Z that is perpendicular to the first direction X and the second direction Y. As well, some mounting systems 10 can include a fourth engaging portion 124 located along the portion of the second extension wall 94. The fourth engaging portion can be spaced from the second engaging portion 112 along the third direction Z.

Figure 24:
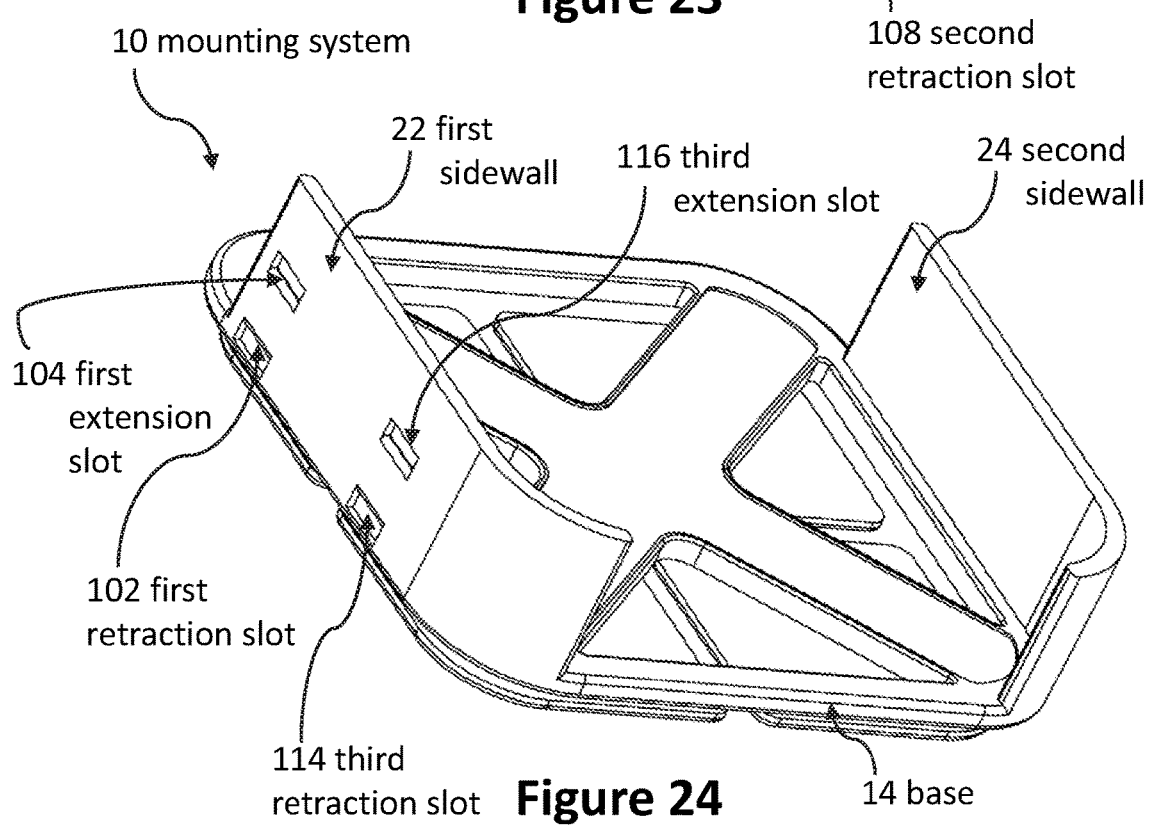
FIG. 24 illustrates a second side perspective view of an embodiment of a mounting system, according to some embodiments.
Figure 25:
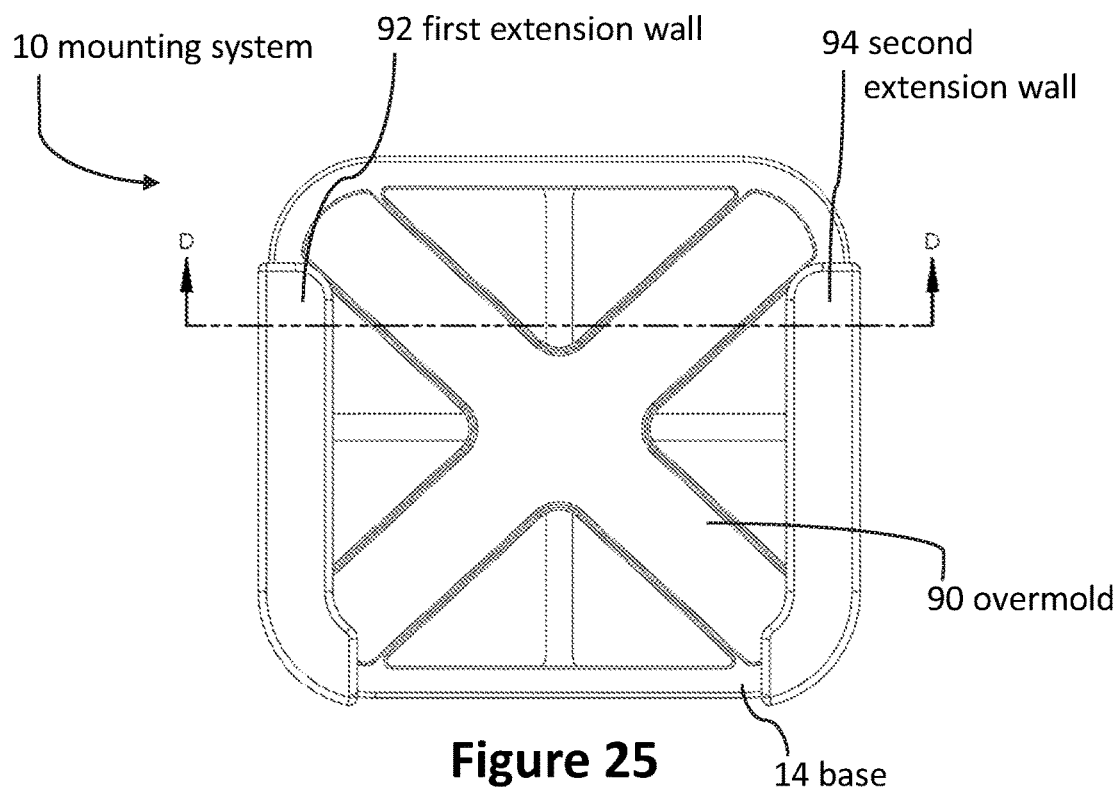
FIGS. 25 and 26 illustrate front views of embodiments of mounting systems, according to some embodiments.
Figure 26:
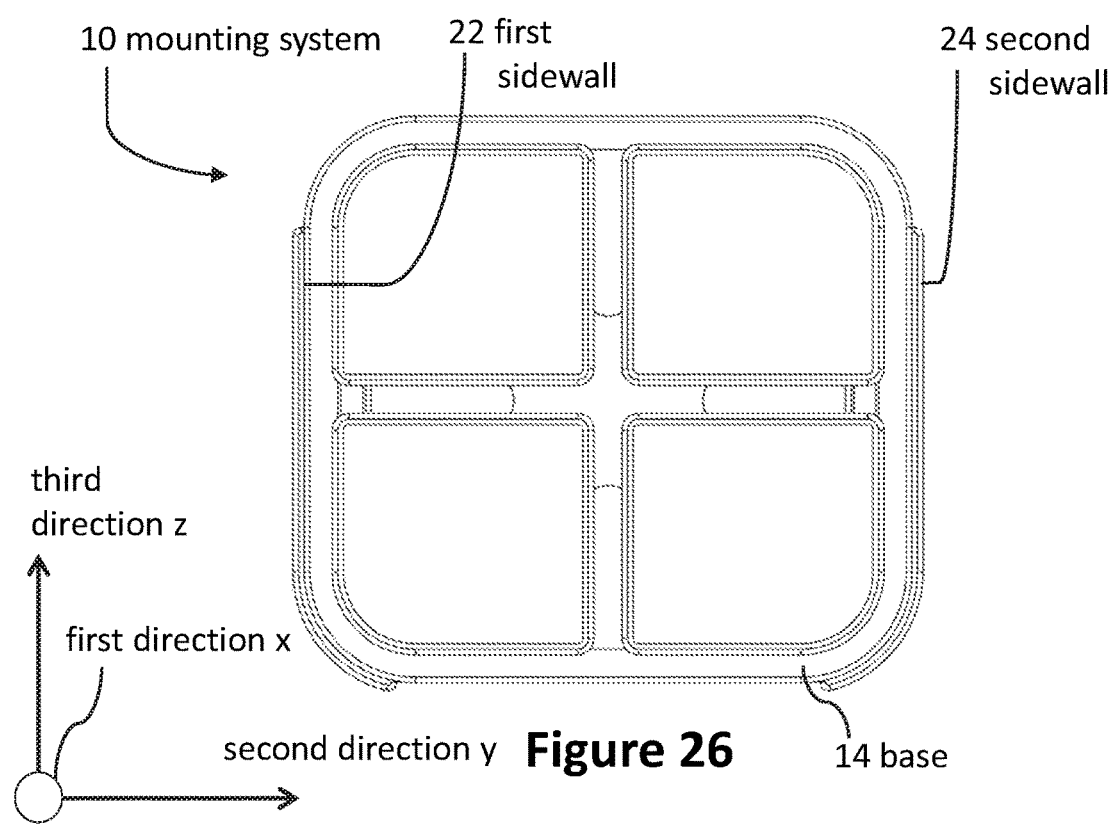
Figure 27:
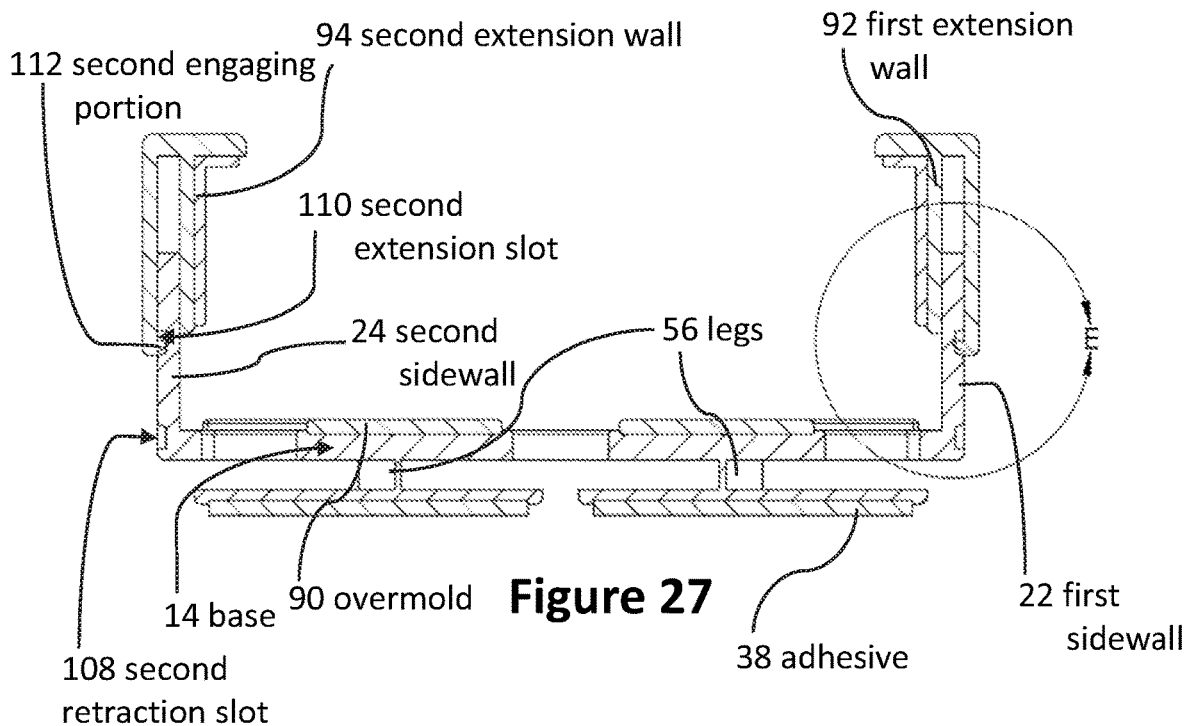
FIG. 27 illustrates a cross-sectional view along line D-D from FIG. 25 with first and second extension walls in an extended position, according to some embodiments.

As shown in FIGS. 23 and 24, embodiments of the mounting system 10 can include a third retraction slot 114 located along the outer surface of the first sidewall 22. The third retraction slot 114 can be spaced from the first retraction slot 102 along the third direction Z. The third retraction slot 114 can thereby be configured to receive the third engaging portion 118 when the first extension wall 92 is in the retracted position 86. As well, embodiments of the mounting system 10 can include a fourth retraction slot 120 located along the outer surface of the second sidewall 24. The fourth retraction slot 120 can be spaced from the second retraction slot 108 along the third direction Z. The fourth retraction slot 120 can thereby be configured to receive the fourth engaging portion 124 when the second extension wall 94 is in the retracted position 86.

As further shown in FIGS. 23 and 24, the mounting system 10 can also include a third extension slot 116 located along the outer surface of the first sidewall 22. In some embodiments, the third retraction slot 114 can be located closer to the base 14 than the third extension slot 116. The third extension slot 116 can be configured to receive the third engaging portion 118 when the first extension wall 92 is in the extended position 88. Embodiments of the mounting system 10 can also include a fourth extension slot 122 located along the outer surface of the second sidewall 24. The fourth retraction slot 120 can be located closer to the base 14 than the fourth extension slot 122. As well, the fourth extension slot 122 can be configured to receive the fourth engaging portion 124 when the second extension wall 94 is in the extended position 88.

Embodiments of the mounting system 10 can include additional features to aid in the movement of the first and second extension walls 92, 94 between the retracted position 86 and the extended position 88. More specifically, the additional features can help to unlock the respective engaging portions from the respective extension and/or retraction slots. In some embodiments, as shown in FIG. 27-30, the first retraction slot 102 comprises a first ramp 414 and the second retraction slot 108 comprises a third ramp 418. As the first engaging portion 106 slides across the first ramp 414, the first extension wall 92 can thereby move from the retracted position 86 to the extended position 88. As such, the first ramp 414 can allow the first engaging portion 106 to more easily unlock from the first retraction slot 102 when the first extension wall 92 moves from the retracted position 86 towards the extended position 88. As well, the third ramp 418 can allow the second engaging portion 112 to more easily unlock from the second retraction slot 108 when the second extension wall 94 moves from the retracted position 86 towards the extended position 88.

Furthermore, in order to assist in unlocking the extension walls 92, 94 from the extended position 88, the first extension slot 104 can include a second ramp 416 and the second extension slot 110 can include a fourth ramp 420. As the first engaging portion 106 slides across the second ramp 416, the first extension wall 92 moves from the extended position 88 to the retracted position 86. As well, when the second engaging portion 112 slides across the fourth ramp 420, the second extension wall 94 moves from the extended position 88 to the retracted position 86. As such, the second ramp 416 can allow the first engaging portion 106 to more easily unlock from the first extension slot 104 when the first extension wall 92 moves from the extended position 88 towards the retracted position 86. As well, the fourth ramp 420 can allow the second engaging portion 112 to more easily unlock from the second extension slot 110 when the second extension wall 94 moves from the extended position 88 towards the retracted position 86.

Some embodiments may even include additional features to further assist in unlocking the extension walls 92, 94 as they move from the retracted position 86 and/or the extended position 88. As further shown in FIGS. 27-30, the first engaging portion 106 can include a first angled surface 422 configured to slide across the second ramp 416 when the first extension wall 92 moves from the extended position 88 to the retracted position 86. As well, the second engaging portion 112 can comprise a second angled surface 424 configured to slide across the fourth ramp 420 when the second extension wall 94 moves from the extended position 88 to the retracted position 86. For example, the first angled surface 422 can allow the first engaging portion 106 to more easily unlock from the first extension slot 104 to thereby move the first extension wall 92 from the extended position. As well, the second angled surface 424 can allow the second engaging portion 112 to more easily unlock from the second extension slot 110 to thereby move the second extension wall 94 from the extended position. It should be appreciated that the angled surfaces can be disposed along any surface of the respective first engaging portion 106 and/or the second engaging portion 112. For example, the first angled surface 422 could be disposed along an opposite facing surface, as the surface that the first angled surface 422 is disposed in FIGS. 27 and 28. In this regard, this opposite configuration could assist the first engaging portion 106 to more easily unlock from the first retraction slot 102 to thereby move the first extension wall 92 from the retracted position 86.

Figure 18:
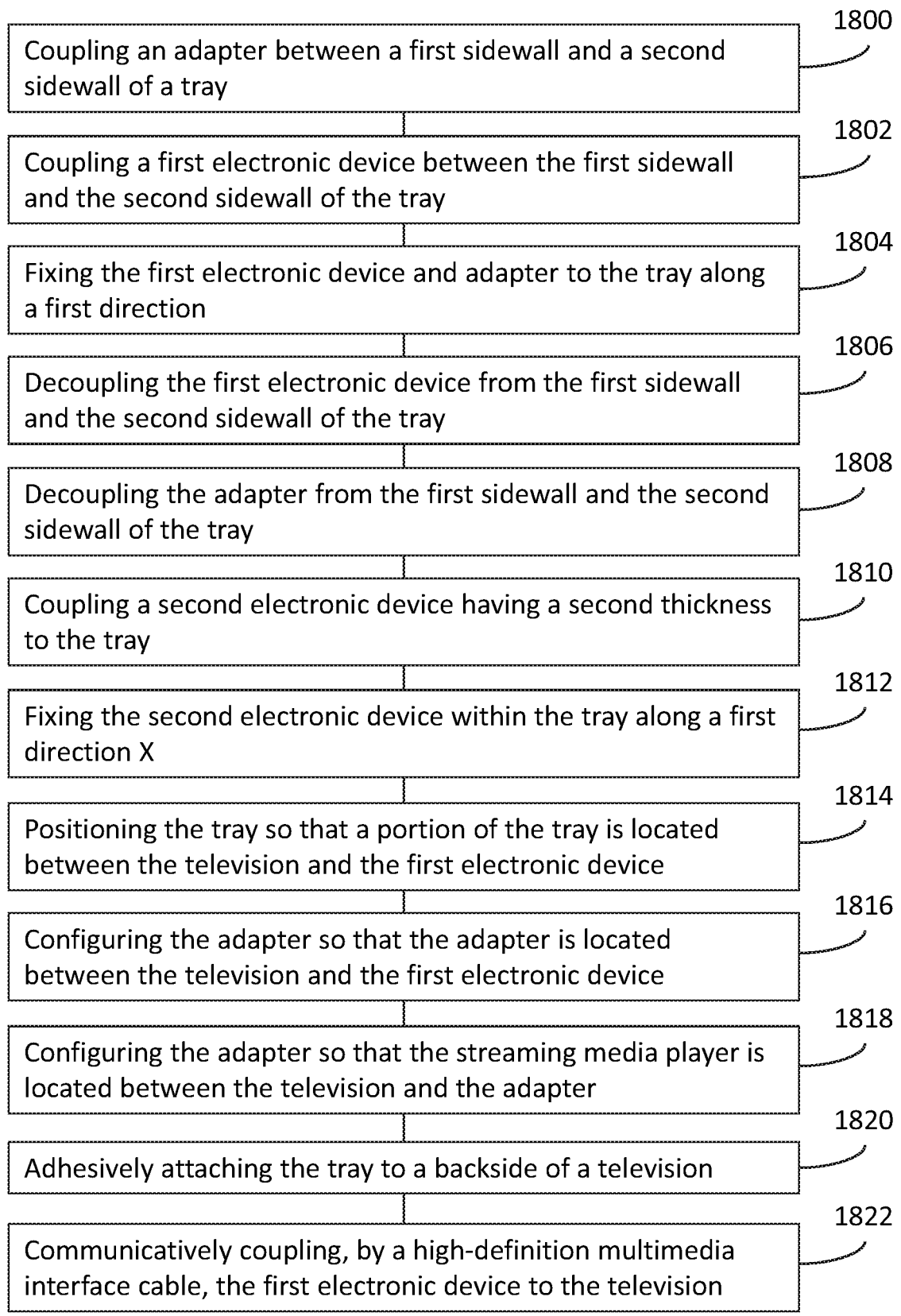
FIG. 18 illustrates a diagrammatic view of methods, according to some embodiments.

The disclosure also includes methods of using a tray 12 to couple an electronic device 11 to a television 13. As shown in FIG. 18, methods can include coupling an adapter 16 between a first sidewall 22 and a second sidewall 24 of the tray 12 (at step 1800). The first and second sidewalls 22, 24 can extend away from the television 13 along a first direction X. Methods can also include coupling a first electronic device 11a between the first sidewall 22 and the second sidewall 24 of the tray 12 (at step 1802).

Methods can also include fixing the first electronic device 11a and the adapter 16 to the tray 12 along the first direction X (at step 1804). Some methods can even include decoupling the first electronic device 11a from the first sidewall 22 and the second sidewall 24 of the tray 12 (at step 1806).

Even still, methods can include decoupling the adapter 16 from the first sidewall 22 and the second sidewall 24 of the tray 12 (at step 1808).

With continued reference to FIG. 18, methods can even include coupling a second electronic device 11b between the first sidewall 22 and the second sidewall 24 of the tray 12 (at step 1810). In some embodiments, the first electronic device 11a has a first thickness extending along the first direction X. As well, the second electronic device 11b can have a second thickness extending along the first direction X. Even still, the adapter 16 can have a third thickness extending along the first direction X. In some embodiments, the third thickness is substantially equal to the first thickness plus the second thickness. It should be appreciated that the first, second, and third thicknesses can be equal to any size thickness.

Some methods can include fixing the second electronic device 11b to the tray 12 along the first direction X (at step 1812). As well, methods can include positioning the tray 12 so that a portion of the tray 12 is located between the television 13 and the first electronic device 11a (at step 1814). Some embodiments can include configuring the adapter 16 so that the adapter 16 is located between the television 13 and the first electronic device 11a (at step 1816). Even still, some embodiments can include configuring the adapter 16 so that the first electronic device 11a is located between the television 13 and the adapter 16 (at step 1818).

Methods can also include adhesively attaching the tray 12 to a backside surface of the television 13 (at step 1820). As well, methods can include communicatively coupling, by a High-Definition Multimedia Interface cable 70, the first electronic device 11a to the television 13 (at step 1822).

Figure 34:
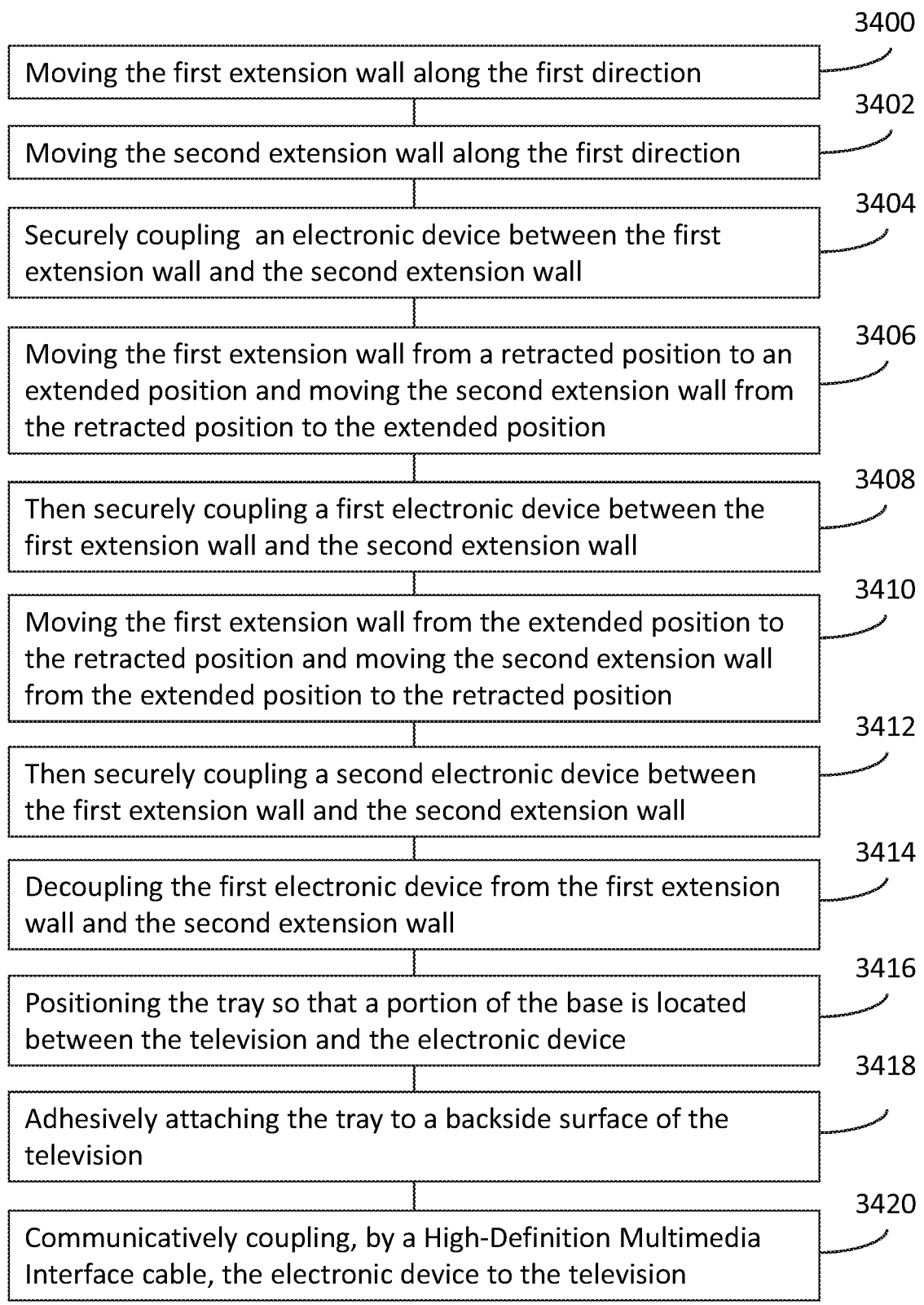
FIG. 34 illustrates a diagrammatic view of methods, according to some embodiments

Now with reference to FIG. 34, the disclosure also includes methods of using a tray 12 to couple an electronic device 11 to a television 13. The tray 12 can comprise a base 14 configured to hold the electronic device 11, a first sidewall 22, a second sidewall 24, a first extension wall slideably coupled to the first sidewall, and a second extension wall slideably coupled to the second sidewall. As shown in FIG. 34, methods can include moving the first extension wall 92 along the first direction X (at step 3400). The first extension wall 92 can move with respect to the first sidewall 22. Methods can also include moving the second extension wall 94 along the first direction X (at step 3402). In some embodiments, the second extension wall 94 moves with respect to the second sidewall (at step 3402). Methods can also include securely coupling an electronic device 11 between the first extension wall 92 and the second extension wall 94 (at step 3404).

Methods can also include moving the first extension wall 92 from a retracted position 86 to an extended position 88 and moving the second extension wall 94 from the retracted position 86 to the extended position 88 (at step 3406). As well, after performing step 3406, methods can then include securely coupling a first electronic device 11a between the first extension wall 92 and the second extension wall 94 (at step 3408). The first electronic device 11a can define a first thickness extending along the first direction X.

In some embodiments, methods include moving the first extension wall 92 from the extended position 86 to the retracted position 88 and moving the second extension wall 94 from the extended position 88 to the retracted position 86 (at step 3410). After performing step 3410, methods can then include securely coupling a second electronic device 11b between the first extension wall 92 and the second extension wall 94 (at step 3412). The second electronic device 11b can define a second thickness extending along the first direction X. In some embodiments, the first thickness is greater than the second thickness.

Methods can even include decoupling the first electronic device 11a from the first extension wall 92 and the second extension wall 94 (at step 3414). In some embodiments, methods include positioning the tray 12 so that a portion of the base 14 is located between the television 13 and the electronic device 11 (at step 3416). In embodiments, the tray 12 can further include an adhesive pad 28 attached to the base 12. Methods can also include adhesively attaching the tray 12 to a backside surface of the television 13 (at step 3418). As well, methods can include communicatively coupling, by an HDMI cable 70, the electronic device 11 to the television 13 (at step 3420).

Interpretation

As used herein, the term "substantially" can be interpreted to have different meanings depending upon the context. For example, "substantially" can mean two surfaces that are within 25-degrees of each other. As well, the term "substantially" can be understood to mean that two protrusions are aligned within 0.5 inches of one another along a defined direction. In other contexts, "substantially" can mean plus or minus 0.5 inches.

As well, the term "about" can be interpreted to mean different things depending upon the context. For example, if the disclosure states that a pad is "about" 0.045 inches thick. The term "about" can mean that the pad is within + or −0.005 inches. In another example, if the disclosure states that a thickness is "about" 0.5 inches thick. The term "about," within this context, can mean that the thickness is within + or −0.05 inches. In yet another example, if the disclosure states that a thickness is "about" 1 millimeter thick. The term "about," within this context, can mean that the thickness is within + or −0.1 millimeters.

"Electronic device" can comprise any electronic device, such as a streaming media player, gaming console, cable box (for bringing digital cable television content from a cable provider to a television), and the like. The term "wall" can comprise any surface located along a television, such as a backside surface of a television. "Wall" can also comprise any wall associated with a building (e.g. home, office building, school, etc.), such as an interior wall and an exterior wall.

"Securely coupled" can mean snugly fit or closely fit. In other words, "securely coupled" can mean that the inside space between the base and a top underside of the extension wall is slightly greater than the thickness (e.g. height) of the electronic device 11.

None of the steps described herein is essential or indispensable. Any of the steps can be adjusted or modified. Other or additional steps can be used. Any portion of any of the steps, processes, structures, and/or devices disclosed or illustrated in one embodiment, flowchart, or example in this specification can be combined or used with or instead of any other portion of any of the steps, processes, structures, and/or devices disclosed or illustrated in a different embodiment, flowchart, or example. The embodiments and examples provided herein are not intended to be discrete and separate from each other.

The section headings and subheadings provided herein are nonlimiting. The section headings and subheadings do not represent or limit the full scope of the embodiments described in the sections to which the headings and subheadings pertain. For example, a section titled "Topic 1" may include embodiments that do not pertain to Topic 1 and embodiments described in other sections may apply to and be combined with embodiments described within the "Topic 1" section.

Some of the devices, systems, embodiments, and processes use computers. Each of the routines, processes, methods, and algorithms described in the preceding sections may be embodied in, and fully or partially automated by, code modules executed by one or more computers, computer processors, or machines configured to execute computer instructions. The code modules may be stored on any type of non-transitory computer-readable storage medium or tangible computer storage device, such as hard drives, solid state memory, flash memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and subcombinations are intended to fall within the scope of this disclosure. In addition, certain method, event, state, or process blocks may be omitted in some implementations. The methods, steps, and processes described herein are also not limited to any particular sequence, and the blocks, steps, or states relating thereto can be performed in other sequences that are appropriate. For example, described tasks or events may be performed in an order other than the order specifically disclosed. Multiple steps may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require at least one of X, at least one of Y, and at least one of Z to each be present.

The term "and/or" means that "and" applies to some embodiments and "or" applies to some embodiments. Thus, A, B, and/or C can be replaced with A, B, and C written in one sentence and A, B, or C written in another sentence. A, B, and/or C means that some embodiments can include A and B, some embodiments can include A and C, some embodiments can include B and C, some embodiments can only include A, some embodiments can include only B, some embodiments can include only C, and some embodiments can include A, B, and C. The term "and/or" is used to avoid unnecessary redundancy.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions, and changes in the form of the methods and systems described herein may be made without departing from the spirit of the inventions disclosed herein.

The following is claimed:

1. A mounting system configurable to couple an electronic device to a television, the mounting system comprising:
   a base;
   a first sidewall that protrudes outward from the base;
   a second sidewall that protrudes outward from the base such that the mounting system is configured to hold a least a portion of the electronic device between the first and second sidewalls;
   an anchor wall oriented within plus or minus 30 degrees of parallel to the base and coupled to the base by at least one connecting protrusion that protrudes inward from the base to the anchor wall;
   an adhesive coupled to the anchor wall and configured to couple the mounting system to the television;
   a first ventilation channel located between the base and the anchor wall; and
   a second ventilation channel in fluid communication with the first ventilation channel, wherein the second ventilation channel is oriented outward from the first ventilation channel such that the second ventilation channel is in fluid communication with an area between the first and second sidewalls, wherein the area is configured to hold the portion of the electronic device.

2. The mounting system of claim 1, wherein the second ventilation channel is oriented within plus or minus fifteen degrees of perpendicular relative to the first ventilation channel.

3. The mounting system of claim 1, wherein the mounting system comprises an outward direction, a first opening, and a second opening, wherein the first opening faces outward, the second opening faces perpendicular to the outward direction, and the first and second ventilation channels fluidly couple the first opening to the second opening such that the mounting system is configured to enable air heated by the electronic device to enter the first opening in an inward direction, pass through the second ventilation channel, pass through the first ventilation channel, and then exit the second opening.

4. The mounting system of claim 1, wherein the mounting system comprises an upward direction oriented perpendicular to an outward direction, and a downward direction oriented perpendicular to the outward direction and perpendicular to the upward direction, the mounting system further comprising at least one of an upward facing opening and a downward facing opening, wherein the first ventilation channel is in fluid communication with at least one of the upward facing opening and the downward facing opening.

5. The mounting system of claim 1, wherein the first ventilation channel extends from a bottom end of the base to a top end of the base.

6. The mounting system of claim 1, wherein the at least one connecting protrusion comprises a flexible neck that couples the base to the anchor wall, and wherein a proximal end of the flexible neck is coupled to an inward side of the base, and a distal end of the flexible neck is coupled to the anchor wall.

7. The mounting system of claim 1, wherein the anchor wall is rigidly coupled to the base by the at least one connecting protrusion, the mounting system further comprising an adapter slideably received by the base between the first and second sidewalls, wherein the adapter comprises an aperture in fluid communication with the first and second ventilation channels.

8. A mounting system configurable to couple an electronic device to a television, the mounting system comprising:
   a base configured to hold the electronic device such that a portion of the base is located between the television and the electronic device, wherein the base comprises a bottom portion, a top portion, a first wall, and a second wall;
   a first ventilation channel located between the first wall and the second wall of the base, wherein the first ventilation channel continues from the bottom portion to the top portion of the base; and
   a second ventilation channel in fluid communication with the first ventilation channel, wherein the second ventilation channel extends outward from the first ventilation channel such that the second ventilation channel fluidly couples the first ventilation channel with a portion of the mounting system configured to hold the electronic device, wherein the base comprises a first sidewall and a second sidewall, and wherein the second ventilation channel, the first sidewall, and the second sidewall extend outward.

9. The mounting system of claim 8, wherein the first ventilation channel continues from the bottom portion of the base to the top portion of the base, the bottom portion contains a first open end configured to provide access to electrical ports of the electronic device, and the top portion contains a second open end.

10. The mounting system of claim 8, further comprising a third ventilation channel in fluid communication with the first ventilation channel, wherein the third ventilation channel extends outward from the first ventilation channel such that the third ventilation channel fluidly couples the first ventilation channel with the portion of the mounting system configured to hold the electronic device, the mounting system further comprising an adhesive configured to couple the base to the television, wherein a first central axis of the first ventilation channel is within plus or minus twenty degrees of a plane of the adhesive.

11. The mounting system of claim 10, wherein the second ventilation channel and the third ventilation channel are within plus or minus forty degrees of being perpendicular to the first central axis of the first ventilation channel, wherein a second central axis of the second ventilation channel is within plus or minus thirty degrees of a third central axis of the third ventilation channel.

12. The mounting system of claim 10, wherein a third central axis of the third ventilation channel is substantially parallel to a second central axis of the second ventilation channel.

13. The mounting system of claim 10, further comprising:
a fourth ventilation channel in fluid communication with the first ventilation channel, wherein the fourth ventilation channel extends outward from the first ventilation channel such that the fourth ventilation channel fluidly couples the first ventilation channel with the portion of the mounting system configured to hold the electronic device; and
a fifth ventilation channel in fluid communication with the first ventilation channel, wherein the fifth ventilation channel extends outward from the first ventilation channel such that the fifth ventilation channel fluidly couples the first ventilation channel with the portion of the mounting system configured to hold the electronic device.

14. The mounting system of claim 13, further comprising:
a sixth ventilation channel in fluid communication with the first ventilation channel, wherein the sixth ventilation channel extends outward from the first ventilation channel such that the sixth ventilation channel fluidly couples the first ventilation channel with the portion of the mounting system configured to hold the electronic device; and
a seventh ventilation channel in fluid communication with the first ventilation channel, wherein the seventh ventilation channel extends outward from the first ventilation channel such that the seventh ventilation channel fluidly couples the first ventilation channel with the portion of the mounting system configured to hold the electronic device,
wherein the fourth ventilation channel is substantially parallel to the fifth ventilation channel, wherein the fifth ventilation channel is substantially parallel to the sixth ventilation channel, and wherein the sixth ventilation channel is substantially parallel to the seventh ventilation channel.

15. A mounting system configurable to couple an electronic device to a television, the mounting system comprising:
a base configured to hold the electronic device such that a portion of the base is located between the television and the electronic device, wherein the base comprises a bottom portion, a top portion, a first wall, a second wall, a top opening, and a bottom opening;
a first ventilation channel located between the first wall and the second wall of the base, wherein the first ventilation channel continues from the bottom portion to the top portion of the base; and
a second ventilation channel in fluid communication with the first ventilation channel, wherein the second ventilation channel extends outward from the first ventilation channel such that the second ventilation channel fluidly couples the first ventilation channel with a portion of the mounting system configured to hold the electronic device,
wherein the first ventilation channel extends from the top opening to the bottom opening of the base, wherein the top opening and the bottom opening are located between the first wall and the second wall of the base.

16. The mounting system of claim 8, further comprising an adapter slideably received by the base between the first sidewall and the second sidewall, wherein the adapter comprises an aperture that is slideably received by the base between the first sidewall and the second sidewall, and the aperture is in fluid communication with at least one of the first ventilation channel and the second ventilation channel.

17. The mounting system of claim 8, further comprising adhesive configured to couple the base to the television, wherein the first ventilation channel is located between the adhesive and the first wall.

18. The mounting system of claim 17, further comprising at least one leg coupled between the base and the adhesive, wherein the second ventilation channel extends along a first direction, and wherein the at least one leg extends along the first direction.

19. The mounting system of claim 15, further comprising an adapter slideably received by the base between a first sidewall of the base and a second sidewall of the base, wherein the adapter comprises an aperture that is slideably received by the base between the first sidewall and the second sidewall, and the aperture is in fluid communication with the first ventilation channel and the second ventilation channel.

20. The mounting system of claim 15, further comprising adhesive configured to couple the base to the television.

* * * * *